United States Patent

Murashita et al.

[11] Patent Number: 5,854,597
[45] Date of Patent: Dec. 29, 1998

[54] DOCUMENT MANAGING APPARATUS, DATA COMPRESSING METHOD, AND DATA DECOMPRESSING METHOD

[75] Inventors: Kimitaka Murashita; Shigeru Yoshida; Yoshiyuki Okada, all of Kanagawa, Japan

[73] Assignee: Fujitsu Limited, Kawasaki, Japan

[21] Appl. No.: 787,537

[22] Filed: Jan. 22, 1997

[30] Foreign Application Priority Data

Mar. 19, 1996 [JP] Japan ................................. 8-063573

[51] Int. Cl.$^6$ ................................................. H03M 7/30
[52] U.S. Cl. ................................................. 341/51; 341/50
[58] Field of Search .................... 341/50, 51; 364/281.3

[56] References Cited

U.S. PATENT DOCUMENTS

| | | | |
|---|---|---|---|
| 4,500,955 | 2/1985 | Chang | 364/200 |
| 5,140,644 | 8/1992 | Kawaguchi et al. | 382/10 |
| 5,471,610 | 11/1995 | Kawaguchi et al. | 395/600 |

FOREIGN PATENT DOCUMENTS 5-54077   3/1993   Japan .

Primary Examiner—Brian K. Young
Assistant Examiner—Peguy JeanPierre
Attorney, Agent, or Firm—Staas & Halsey

[57] ABSTRACT

In a document managing apparatus for forming a compressed document file where a keyword retrieval is available, a first process operation and a second process operation are alternately executed. In the first process operation, when document data to be compressed is given, the respective characters are directly written into a compressed document file until an end control character string appears in this document data. In the second process operation, data obtained by coding the respective characters are written into the compressed document file until a start control character series appears in the document data. Also, in this document managing apparatus, a third process operation and a fourth process operation are alternately performed, when the compressed document file is restored. In the third process operation, the respective data (characters) are directly outputted until the end control character string appears in the data contained in the compressed document file. In the fourth process operation, the decoding operation is carried out until the start control character string appears in the restored result of the data contained in the compressed document file.

20 Claims, 22 Drawing Sheets

FIG. 4

```
<TITLE>SPECIFICATION OF THE INVENTION</TITLE><P>
<SECTION>1. TITLE OF THE INVENTION</SECTION>
DOCUMENT MANAGING APPARATUS AND DOCUMENT MANAGING METHOD
<SECTION>2. SCOPE OF CLAIM FOR A PATENT</SECTION>
<SUBSECTION>A DOCUMENT MANAGING APPARATUS FOR HANDLING
DOCUMENT DATA WITH A TAG, COMPRISING;</SUBSECTION>
<LIST>
  <ITEM>······
</LIST><P>
<SECTION>3. DETAILED DESCRIPTION OF THE INVENTION</SECTION>
<SUBSECTION>(1) INDUSTRIAL FIELD OF UTILIZATION</SUBSECTION>
<PARAGRAPH>THE PRESENT INVENTION RELATES TO A DOCUMENT
MANAGING APPARATUS AND A DOCUMENT MANAGING METHOD,······
<SUBSECTION>(2) PRIOR ART</SUBSECTION>
<PARAGRAPH>VERY RECENTLY, VARIOUS SORTS OF DATA SUCH AS
CHARACTER CODES, VECTOR INFORMATION, AND IMAGES ARE HANDLED
BY COMPUTERS. ······
<PARAGRAPH>ON THE OTHER HAND, THERE IS A TREND TO UNITE
FORMATS OF DOCUMENTS HANDLED BY COMPUTERS IN RECENT YEAR.
THIS TREND IMPLIES THAT DOCUMENTS WITH DIFFERENT FORMATS FOR
COMPUTERS, OR APPLICATION SOFTWARE CAN BE USED UNDER
DIFFERENT COMPUTER ENVIRONMENTS.  <TT>SGML</TT> IS ······
```

FIG. 5

```
<TITLE>SPECIFICATION OF THE INVENTION</TITLE><P>
<SECTION>1. TITLE OF THE INVENTION</SECTION>
275fe5a....  (COMPRESSED DATA)
2. SCOPE OF CLAIM FOR A PATENT</SECTION>
61fdc.....  (COMPRESSED DATA)
A DOCUMENT MANAGING APPARATUS FOR HANDLING DOCUMENT DATA
WITH A TAG, COMPRISING;</SUBSECTION>
6ef208c....  (COMPRESSED DATA)
3. DETAILED DESCRIPTION OF THE INVENTION</SECTION>
23fdc.....  (COMPRESSED DATA)
(1) INDUSTRIAL FIELD OF UTILIZATION</SUBSECTION>
425fea....  (COMPRESSED DATA)
(2) PRIOR ART</SUBSECTION>
e75f5a....  (COMPRESSED DATA)
```

FIG. 13

```
<TITLE>SPECIFICATION OF THE INVENTION</TITLE><P>
<SECTION>1. TITLE OF THE INVENTION</SECTION>
275fe5a..... (COMPRESSED DATA)
<SECTION>2. SCOPE OF CLAIM FOR A PATENT</SECTION>
61fdc..... (COMPRESSED DATA)
<SUBSECTION>A DOCUMENT MANAGING APPARATUS FOR HANDLING DOCUMENT DATA WITH A TAG, COMPRISING;</SUBSECTION>
6ef208c..... (COMPRESSED DATA)
<SECTION>3. DETAILED DESCRIPTION OF THE INVENTION</SECTION>
23fdc..... (COMPRESSED DATA)
<SUBSECTION>(1) INDUSTRIAL FIELD OF UTILIZATION</SUBSECTION>
425fea.... (COMPRESSED DATA)
<SUBSECTION>(2) PRIOR ART</SUBSECTION>
e75f5a.... (COMPRESSED DATA)
```

FIG. 14

```
<TITLE>SPECIFICATION OF THE INVENTION</TITLE><P>
<SECTION>1. TITLE OF THE INVENTION</SECTION>
<SECTION>2. SCOPE OF CLAIM FOR A PATENT</SECTION>
<SUBSECTION>A DOCUMENT MANAGING APPARATUS FOR HANDLING
DOCUMENT DATA WITH A TAG, COMPRISING;</SUBSECTION>
<SECTION>3. DETAILED DESCRIPTION OF THE INVENTION</SECTION>
<SUBSECTION>(1) INDUSTRIAL FIELD OF UTILIZATION</SUBSECTION>
<SUBSECTION>(2) PRIOR ART</SUBSECTION>
```

FIG. 16

```
SPECIFICATION OF THE INVENTION
1. TITLE OF THE INVENTION
DOCUMENT MANAGING APPARATUS AND DOCUMENT MANAGING METHOD
2. SCOPE OF CLAIM FOR A PATENT
A DOCUMENT MANAGING APPARATUS FOR HANDLING DOCUMENT DATA
WITH A TAG, COMPRISING;
3. DETAILED DESCRIPTION OF THE INVENTION
(1) INDUSTRIAL FIELD OF UTILIZATION
(2) PRIOR ART
```

FIG. 21

```
<TITLE>SPECIFICATION OF THE INVENTION</TITLE>
2f.... (SECOND COMPRESSED DATA)
<SECTION>1. TITLE OF THE INVENTION</SECTION>
275fe5a.... (SECOND COMPRESSED DATA)
<SECTION>2. SCOPE OF CLAIM FOR A PATENT</SECTION>
61fdc.... (COMPRESSED DATA)
<SUBSECTION>A DOCUMENT MANAGING APPARATUS FOR HANDLING DOCUMENT DATA WITH A TAG, COMPRISING;</SUBSECTION>
6ef208c.... (SECOND COMPRESSED DATA)
<SECTION>3. DETAILED DESCRIPTION OF THE INVENTION</SECTION>
23fdc.... (SECOND COMPRESSED DATA)
<SUBSECTION>(1) INDUSTRIAL FIELD OF UTILIZATION</SUBSECTION>
425fea.... (SECOND COMPRESSED DATA)
<SUBSECTION>(2) PRIOR ART</SUBSECTION>
e75f5a.... (SECOND COMPRESSED DATA)
```

DOCUMENT MANAGING APPARATUS, DATA COMPRESSING METHOD, AND DATA DECOMPRESSING METHOD

BACKGROUND OF THE INVENTION

1. Field of the Invention

The present invention generally relates to a document managing apparatus, a data compressing method, and a data decompressing method. More specifically, the present invention is directed to a document managing apparatus for compressing document data to manage the compressed document data, and to data compressing/data decompressing methods used to compress/decompress document data and the like.

2. Description of the Related Art

Recently, various sorts of data such as character codes, vector information, and image information are processed in computers. On the other hand, since amounts of processed data are rapidly increased, these data are compressed so as to reduce transmission time and to utilize storage apparatuses in higher efficiency.

For instance, in an application software called an "archiver", a single compressed data file is formed from more than one file. Files having low use frequencies and old files are compressed by employing the archiver, so that capacities of these files may be reduced. Then, when contents of files are communicated, if the compressed data file formed by the archiver is used, then time required for this data file communication may be shortened and further communication cost may be lowered.

Also, drive units such as hard disk units and floppy disk units may be operated as compression drive units. In systems having compressed drive units, when a user issues a file writing instruction, this file is automatically compressed and the compressed file is stored in the compression drive units. Then, when the user issues a file reading instruction, the file stored in the compression drive is automatically restored.

It should be noted that since various sorts of data such as texts, machine languages, images, and voice are processed in computer systems, the universal coding system corresponding to the coding system applicable to the various sorts of data when the file is compressed, as described above. Concretely speaking, the dictionary coding method for utilizing data (character) reproductivity, the arithmetic coding classified to the probability/statistical type coding, and the Splay-Tree coding have been utilized.

On the other hand, as to files which are not compressed, contents of these non-compressed files can be confirmed by performing the keyword retrieval. For example, as to document data formed in the SGML (Standard Generalized Markup Language) format, tags are used before/after a specific element contained in this document data, and the tags correspond to the content of this specific element. As a consequence, in the document data formed in the SGML format, the tags attached to the subject information are retrieved from the file, and if the character string stored after this information is read, then the necessary information can be obtained.

However, when the document data formed in the SGML format is compressed, tag retrieval can no longer be carried out. Accordingly, even when only a title is to be confirmed, the overall compressed file has to be restored, resulting in lengthy confirmation works.

SUMMARY OF THE INVENTION

An object of the present invention is to provide a document managing apparatus for forming compressed document data capable of being retrieved by employing a keyword.

Another object of the present invention is to provide a data compressing method for forming compressed data capable of being retrieved by using a keyword, and also to provide a data decompressing method for decompressing the compressed data formed by this data compressing method.

A first document managing apparatus is comprised of a control character string input unit, a coding unit, a retrieving unit, and a control unit. The control character string storing unit stores more than one starting control character string and more than one end control character string. The coding unit encodes a character to thereby output coded character data. The retrieving unit retrieves a start control character string and an end control character string from a character string made by arranging inputted characters. When said start control character string is retrieved by said retrieving unit, the control unit commences a process operation such that coded character string data produced by coding the inputted character string by said coding unit is outputted as an element of the compressed document data, and when said end control character string is retrieved by said retrieving unit, this control unit commences another process operation such that the inputted character is directly outputted as an element of the compressed document data without character coding by said coding unit.

In other word, the first document managing apparatus forms compressed document data based on the document data, in which the non-compressed data is mixed with the compressed data. As a consequence, the content of the compressed document data formed by the first document managing apparatus can be confirmed by performing the keyword retrieval without being restored. As a result, the document data can be effectively managed by the first document managing apparatus.

It should be understood that the compressed document data formed by the first document managing apparatus is restored by a control character string storing unit, a storing unit, a judging unit, and a control unit. The control character string storing unit stores more than one start control character string and more than one end control character string. The decoding unit outputs a character whose code is decoded. The judging unit judges whether or not a start control character string, or an end control character string is present at a tail of a restored character string. When said judging unit judges the presence of said start control character string, the control unit commences a process operation to output a character produced by decoding the code contained in said compressed document data by employing said decoding unit, and when said judging unit retrieves said end control character string, the control unit commences another process operation to directly output said compressed document data without decoding by said decoding unit.

In the first document managing apparatus of the present invention, as the coding unit, such a unit is employed which outputs a code corresponding to said character by using a dynamic coding model (e.g., dynamic Huffman). Also, as the control unit, such a unit is employed which initializes the dynamic coding model used by said coding unit when said end control character string is retrieved by said retrieving unit. When the document managing apparatus is arranged in this manner, it is possible to form the compressed document data in which only a portion of this content can be restored.

Also, in the first document managing apparatus, as the control unit, such a unit may be employed, when said control unit commences the process operation to directly output said compressed document data without decoding by said decoding unit, that outputs as an element of the compressed document data the end control character string retrieved by said retrieving unit.

In the case that the character managing apparatus is arranged in this manner, the document element sandwiched between the start control character string and the end control character string, present in the document data, is directly stored in the compressed document data. Accordingly, the keyword retrieving operation for the compressed document data can be further executed in accordance with this document managing apparatus.

In the first document managing apparatus of the present invention, as the control unit, such a unit may be employed, when said end control character string is retrieved by said retrieving unit, that substitutes the inputted character by utilizing a substitution table for determining a correspondence relationship between input characters and output characters to thereby output the substituted result without coding of said coding unit.

When the document managing apparatus is arranged in this manner, such compressed document data that does not contain the directly readable data is formed. As a result, even when the compressed document data formed by this document managing apparatus is transferred by employing the internet, the content of this data cannot be read by the illegal machines. Accordingly, secrecy of the data communication can be improved by this document managing apparatus.

It should be noted that when the apparatus is arranged by substituting the character to output the substituted character, it is preferable to additionally employ a substituting unit that substitutes, when an instruction is issued to retrieve a certain character string with respect to the compressed document data, said certain character string by using said substitution table; and a retrieving unit that executes a retrieval with employment of the character string substituted by said substituting unit.

A second document managing apparatus of the present invention is comprised of: a display unit, a first reading unit, a first outputting unit, a first control unit, a second reading unit, a second outputting unit, a second control unit, a storing unit, a display control unit, a designating unit, a storage position specifying unit, and a partially decompressing unit.

The display unit displays data. The control character string storing unit stores more than one start control character string and more than one end control character string. The first reading unit sequentially reads a character contained in document data to be compressed. The first outputting unit directly outputs the character read by said first reading unit as an element of a compressed document file, and also outputs said read character as an element of an index file. The first control unit stops the reading operation of said first reading unit when said first reading unit reads the same character string as any of said start control character strings stored in said control character string storing unit.

The second reading unit commences a reading operation of a character contained in said document data when the reading operation of said first reading unit is stopped by said first control unit. The second outputting unit outputs a code corresponding to the character read by said second reading unit as an element of compressed document data. When second reading unit reads the same character string as any of the end control character string stored in said control character string storing unit, the second control unit stops the reading operation by said second reading unit and also restarts the reading operation by said first reading unit. The storing unit stores said compressed document file and said index file. The display control unit displays the respective data segmented by said end control character string and contained in said index file stored in said storing unit, on said display unit as an index when a predetermined instruction is issued. The designating unit designates one index from the indexes displayed by said display control unit. The storage position specifying unit specifies a storage position of the index designated by said designating unit within said compressed document file. The partially decompressing unit restores data located subsequent to the storage position specified by said storage position specifying unit and stored in said compressed document file until any of the end control character strings stored in said control character string storing unit is restored.

In other words, the second document managing apparatus of the present invention forms such a compressed document file based upon the document data, in which the non-compressed data (data outputted from first output unit) is mixed with the compressed data (data outputted from second output unit), and further forms the index file constructed of the data outputted from the first output unit.

The content of the index file stored in the storing unit is displayed by the display control unit on, for instance, the display unit such as a CRT. The user designates one index from a plurality of indexes displayed on the display unit by employing the designating unit arranged by such an input apparatus as a keyboard and a mouse. The storage position specifying unit specifies a storage position of the index designated by said designating unit within said compressed document file. The partially decompressing unit restores data located subsequent to the storage position specified by said storage position specifying unit and stored in said compressed document file until any of the end control character strings stored in said control character string storing unit is restored.

As described above, in the second document managing apparatus, since the function for decompressing only a portion of the contents of the compressed document file is provided, the contents can be confirmed even when the overall compressed document file is not restored. As a consequence, in accordance with the second document managing apparatus, while the storage capacity of the storing unit arranged by a hard disk unit is effectively utilized, the document data can be processed in high efficiency.

This second document managing apparatus may be further comprised of a multiplied size detecting unit for detecting a multiplied size of data to store the detected multiplied size, said data being outputted as the elements of the compressed document data every time said first output unit commences to output the elements of the compressed document data; and as the storage position specifying unit, a unit for specifying the storage position of said index within the compressed document file based on the multiplied size stored in said multiplied size detecting/storing unit.

Also, the second document managing apparatus may be employed with such a partially decompressing unit constructed of a restore-not-required data recognizing unit, a first data reading unit, a first decoding unit, a first read controlling unit, a second data reading unit, a second decoding unit, a second reading control unit, and a third reading control unit.

The restore-not-required data recognizing unit recognizes that the data located preceding the storage position specified by said storage position specifying unit and contained in said compressed document file is equal to processed data. The first data reading unit sequentially reads unprocessed data contained in said compressed document file every one character. The first decoding unit outputs the data read by said first data reading unit as a decoded result. The first reading control unit stops the reading operation of said first data reading unit when said first decoding unit outputs the same character string as any of said start control character strings stored in said control character string storing unit.

The second data reading unit commences a reading operation of the unprocessed data contained in said compressed document file when the reading operation of said first data reading unit is stopped by said first reading control unit. The second decoding unit outputs a character obtained by decoding the data read by said second data reading unit.

When said second decoding unit outputs the same character string as any of the end control character string stored in said control character string storing unit, the second reading control unit stops the reading operation by said second data reading unit. The third reading control unit restarts the reading operation of said first data reading unit when the control operation is carried out by said second reading control unit, in the case that the character string read by said second data reading unit is not equal to an end control character string corresponding to a start control character string contained in a tail of an index specified by said specifying unit.

When the partially decompressing unit with the above-described arrangement is employed, the data within the range corresponding to the index designated by the designating unit can be restored.

A third document managing apparatus of the present invention is comprised of a display unit, a first reading unit, a first outputting unit, a first control unit, a second reading unit, a second outputting unit, a second control unit, a multiplied size detecting/storing unit, a storing unit, a first display control unit, a designating unit, a decoding-not-required data recognizing unit, a first data reading unit, a first decoding unit, a first decoding control unit, a second data reading unit, a second decoding unit, a second decoding control unit, and a third decoding control unit.

The display unit displays data. The control character string storing unit stores more than one start control character string and more than one end control character string. The first reading unit for sequentially reads a character contained in document data to be compressed. The first outputting unit directly outputs a code obtained by statically coding the character read by said first reading unit as an element of a compressed document file, and also outputs said read character as an element of an index file. The first control unit stops the reading operation of said first reading unit when said first reading unit reads the same character string as any of said start control character strings stored in said control character string storing unit.

The second reading unit commences a reading operation of a character contained in said document data when the reading operation of said first reading unit is stopped by said first control unit. The second outputting unit outputs a code obtained by dynamically coding the character read by said second reading unit as an element of compressed document data. When said second reading unit reads the same character string as any of the end control character string stored in said control character string storing unit, the second control unit stops the reading operation by said second reading unit, initializes a model employed to dynamically encode the character by said second output unit, and also restarts the reading operation by said first reading unit. The multiplied size detecting/storing unit detects a multiplied size of data which have been outputted as the elements of the compressed document file by said first outputting unit and said second outputting unit every time said first output unit starts to output said character, and stores said detected multiplied size.

The storing unit stores said compressed document file and said index file. The first display control unit displays the respective data segmented by said start control character string and contained in said index file stored in said storing unit, on said display unit as an index when a predetermined instruction is issued.

The designating unit designates one index from the indexes displayed by said first display control unit. The decoding-not-required data recognizing unit specifies a storage position of the index designated by said designating within said compressed document file based on the multiplied size stored in said multiplied size detecting/storing unit, and recognizes data preceding said designated index within said compressed document file as processed data. The first data reading unit reads unprocessed data contained in said compressed document file. The first decoding unit outputs a character obtained by statically decoding the data read by said first data reading unit as a decoded result. The first decoding control unit stops the reading operation of said first data reading unit when said first decoding unit decodes the same character string as any of said start control character strings stored in said control character string storing unit. The second data reading unit commences a reading operation of unprocessed data contained in said compressed document file when the reading operation of said first data reading unit is stopped by said first decoding control unit. The second decoding unit outputs a character obtained by dynamically decoding the data read by said second data reading unit. When said second decoding unit decodes the same character string as any of the end control character string stored in said control character string storing unit, the second control unit stops the reading operation by said second data reading unit and also initializes a model used to dynamically decode the data by said second decoding unit. The third decoding control unit restarts the reading operation of said first reading unit when the control operation is carried out by said second decoding control unit, in the case that the character string decoded by said second decoding unit is not equal to an end control character string corresponding to a start control character string contained in a tail of an index designated by said designating unit.

In other words, the third document managing apparatus of the present invention forms such a compressed document file based upon the document data, in which the statically encoded non-compressed data (data outputted from first output unit) is mixed with the dynamically encoded compressed data (data outputted from second output unit), and further forms the index file constructed of the non-compressed data corresponding to the compressed document data outputted from the first output unit.

The content of the index file stored in the storing unit is displayed by the display control unit on, for instance, the display unit such as a CRT. The user designates one index from a plurality of indexes displayed on the display unit by employing the designating unit arranged by such an input apparatus as a keyboard and a mouse.

The decoding-not-required data recognizing unit specifies a storage position of the index designated by said designating unit within said compressed document file based on the multiplied size stored in said multiplied size detecting/storing unit, and recognizes data preceding said designated index within said compressed document file as processed data. Then, the process operations by the respective units are repeated until the end control character string is restored which corresponds to the start control character string contained in the tail of the index designated by the user with respect to the data subsequent to the data recognized as the processed data by this decoding-not-required data recognizing unit.

As described above, since the third document managing apparatus forms the compressed document file in which the document data are compressed by employing two sorts of compressing methods, the size of the compressed document file can be made small, and the storage capacity of the storing unit arranged by the hard disk unit or the like can be effectively utilized. Also, since the index file capable of being retrieved by the keyword is formed, the content thereof can be predicted even when the compressed document file is not restored. Also, since such a function is employed that restores only a portion of the contents of the compressed document file, only necessary portion can be restored. As a result, the document data can be effectively processed by the third document managing apparatus.

A data compressing method according to the present invention may compress original data such that start control character strings and end control character strings have been inserted before/after elements of several data.

The data compressing method of the present invention is comprised of a retrieving step and a data processing step.

In the retrieving step, the start control character string and the end control character string are retrieved from said original data. In the data processing step, when said start control string is retrieved at said retrieving step, a process operation is commenced to output encoded data obtained by coding original data subsequent to the first-mentioned original data; and when said end control character string is retrieved in said retrieving step, another process operation is commenced to directly output the original data subsequent to the first-mentioned original data.

As described above, in the data compressing method of the present invention, such compressed data that the non-compressed data is mixed with the compressed data is formed, namely the compressed data retrievable by the keyword is formed.

The compressed data file formed by this data compressing method is restored by the following data decompressing method.

That is, the data decompressing method of the present invention is comprised of a judging step and a data processing step.

In the judging step, it is judged as to whether or not the start control character string or the end control character string is present at a tail of restored data. In the data processing step, when the presence of said start control character string is judged at said judging step, a process operation is commenced to output as a restored result a character obtained by decoding compressed data subsequent to the first-mentioned compressed data. Also, when said end control character string is retrieved in said judging step, another process operation is commenced to directly output as the restored result the compressed data subsequent to the first-mentioned compressed data.

In the data compressing method of the present invention, it is also possible to employ as the data processing step, such a step that performs the coding operation by employing a dynamic coding model, and initializes said dynamic coding model when said end control character string is retrieved at said retrieving step.

When the compressed data formed by this data compressing method is restored, it is also possible to employ as the above-described data processing step of the data decompressing method, such a step that performs the coding operation by employing a dynamic coding model, and initializes said dynamic coding model when said end control character string is retrieved at said retrieving step.

In the data compressing method of the present invention, it is also possible to employ as the data processing step, such a step where when the process operation to output the encoded data is commenced, said end control character string retrieved at said retrieving step is outputted as an element of the compressed data.

When the compressed data formed by this data compressing method is restored, it is also possible to employ as the above-described data processing step of the data decompressing method, such a step where when a process operation to output a decoded character is commenced, a firstly decoded control character string is not handled as the restored result.

Also, in the data compressing method of the present invention, it is possible to employ as the data processing step, such a step where when said end control character string is retrieved in said retrieving step, a process operation is commenced to output as an element of compressed data the data obtained by substituting original data subsequent to the first-mentioned original data by employing a predetermined substitution table.

When the compressed data formed by this data compressing method is restored, it is also possible to employ as the above-described data processing step of the data decompressing method, such a step where when said end control character string is retrieved in said retrieving step, a process operation is commenced to output as the restored data obtained by substituting compressed data subsequent to the first-mentioned compressed data by employing a predetermined substitution table.

BRIEF DESCRIPTION OF THE DRAWINGS

A more complete understanding of the teachings of the present invention may be acquired by referring to the accompanying drawings, in which:

FIG. 4 represents an example of document data described in the SGML format;

FIG. 5 schematically shows a compressed document file formed from the document data shown in FIG. 4 by the document managing apparatus according to the first embodiment of the present invention;

FIG. 13 schematically indicates the compressed document file formed by the document managing apparatus according to the third embodiment of the present invention;

FIG. 14 schematically shows an index file formed by the document managing apparatus according to the third embodiment of the present invention;

FIG. 16 is a flow chart for describing a sequence to form a compressed document file by the apparatus according to the third embodiment of the present invention;

FIG. 21 schematically indicates the compressed document file formed by the document managing apparatus according to the fourth embodiment of the present invention.

DETAILED DESCRIPTION OF THE PREFERRED EMBODIMENTS

Before describing various preferred embodiments of the present invention, an overview of a description format for document data to be managed by a document managing apparatus according to the present invention will now be summarized. That is, the document managing apparatus according to the present invention is directed to manage document data such that a character for controlling a document, and the document are stored in the same data. In this specification, document data described in the SGML (Standard Generalized Markup Language) format is managed by the document managing apparatus according to various embodiments of the present invention. Document data described in the SGML format corresponds to the international document format standard determined by ISO in 1986 (IS8879). In document data described in the SGML format, a control character string is used and is located before/after a specific element contained in the document data. This control character string is called a "tag" corresponding to a content of this specific element. For instance, a starting tag "<TITLE>" is used before an element indicative of a document title, and an end tag "</TITLE>" is used after this element.

FIRST DOCUMENT MANAGING APPARATUS

A document managing apparatus, according to a first embodiment of the present invention, produces a file in which compressed data and non-compressed data are mixed with each other (referred to as a "compressed document file" hereinafter) when document data is filed.

Figure 1:
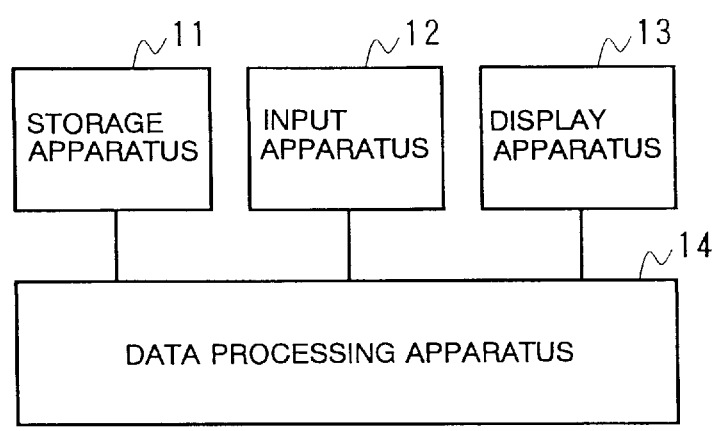
FIG. 1 is a schematic block diagram for showing an arrangement of a document managing apparatus according to a first embodiment of the present invention.

In FIG. 1, there is schematically shown an arrangement of a document managing apparatus according to a first embodiment of the present invention. As indicated in this drawing, the document managing apparatus according to the first embodiment is arranged by a storage apparatus 11, an input apparatus 12, a display apparatus 13, and a data processing apparatus 14. The storage apparatus 11 is a so-called "magnetic disk storage apparatus" for storing a compressed document file and the like. The input apparatus 12 is constituted by a keyboard, a mouse, and a peripheral device thereof. The display apparatus 13 is constructed of a CRT (cathode-ray tube) and a peripheral device thereof, and is employed so as to display thereon a restored result of the compressed document file stored in the storage apparatus 11.

The data processing apparatus 14 is mainly arranged by a CPU (central processing unit), and has a function to edit document data. The data processing apparatus 14 executes a process operation to form a compressed document file from document data, and another process operation to restore a compressed document file to document data in response to an instruction issued from the input apparatus 11.

FORMING OPERATION OF COMPRESSED DOCUMENT FILE

Operations of this first document managing apparatus (namely, data processing apparatus 14) will now be explained.

Referring first to a functional block diagram of FIG. 2, a description will be made of an operation to form a compressed document file by the data processing apparatus 14.

Figure 2:
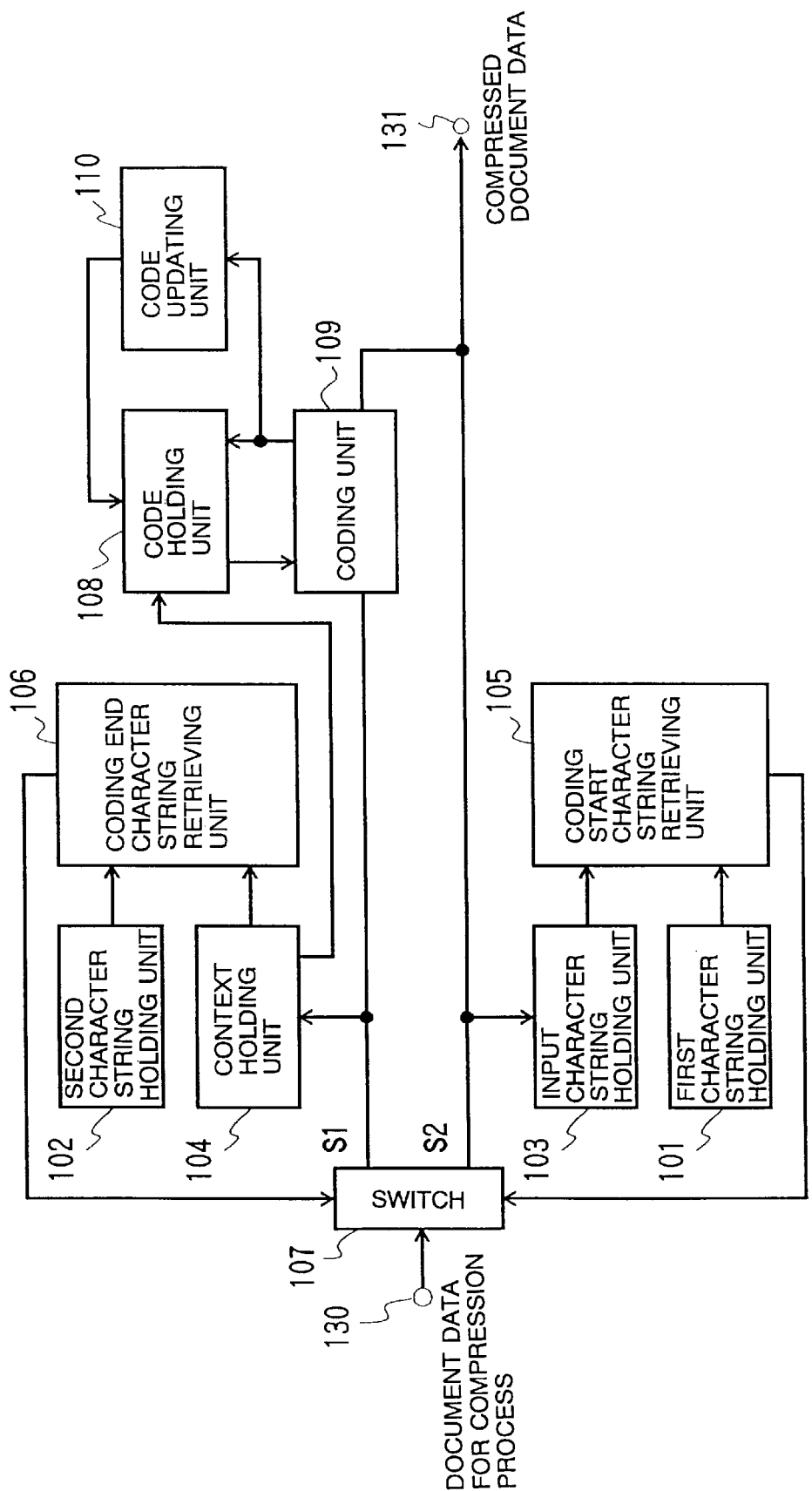
FIG. 2 is a functional block diagram for explaining a sequence to form a compressed document file by employing the document managing apparatus according to the first embodiment of the present invention.

As indicated in FIG. 2, the data processing apparatus 14 is constructed of a switch 107, an input character string holding unit 103, a first character string holding unit 101, and a coding start character string retrieving unit 105, which are provided on the side of a terminal S2 of the switch 107. The data processing apparatus 14 also includes a second character string holding unit 102, a context holding unit 104, and a coding end character string retrieving unit 106, which are provided on the side of another terminal S1 of the switch 107. The first data processing apparatus 14 further includes a code holding unit 108, a coding unit 109, and a code updating unit 110, which are provided on the side of the terminal S1 of the switch 107.

Document data to be compressed is supplied from an input terminal 130 to the switch 107 with respect to each character. The switch 107 is a switch for outputting the inputted character from either terminal S1 or terminal S2. When a compressed document file is commenced to be formed, the switch 107 outputs a character from the terminal S2.

First, a description is made of operations of the respective circuit units in this data processing apparatus 14 when the switch 107 outputs the character from the terminal S2. When the character is outputted from the terminal S2 of the switch 107, the input character string holding unit 103, the first character string holding unit 101, and the coding start character string retrieving unit 105 may function. The character derived from the terminal S2 is outputted from an output terminal 131 to thereby constitute constructive data of the compressed document file, and also is inputted to the input character string holding unit 103.

The input character string holding unit 103 function to hold a character string constructed of a preselected number (N1) of characters, and updates a content of a held character string by the characters supplied from the terminal S2. That is, in the case that a character string arranged by (M<N1) pieces of characters is held, if the character is supplied from the terminal S2, then the input character holding unit 103 adds the supplied character to the end of this character string. In the case that another character string constructed of N1 pieces of characters is held, if the character is supplied from the terminal S2, then the input character string holding unit 103 deletes one character from the head portion of this character string, and adds the character derived from the terminal S2 to this end of the character string.

The first character string holding unit 101 holds several coding start character strings (</SECTION>, </SUBSECTION> etc.) selected from the end tag. It should be noted that the maximum value N1 of the character number of the character strings held by the input character string holding unit 103 is equal to the character number of the longest coding start character string held in the first character string holding unit 103.

The coding start character string retrieving unit 105 retrieves as to whether or not there is a character string coincident with any of the coding start character strings held in the first character string holding unit 101, in a tail of this character string in the input character string holding unit 103 every time a new character is inputted in the input character string holding unit 103. Then, when there is no character string coincident with any of the coding start character strings, the coding start character string retrieving unit 105 executes no retrieving operation, and waits for an entry of the next character. On the other hand, when the character string coincident with the coding start character string is present, the coding start character string retrieving unit 105 operates the switch 107 to change the data outputted from the terminal S2 to the terminal S1.

For instance, when such a character string as "***</SECTION>" is held in the input character string holding unit 103, if a character ">" is supplied from the terminal S2, then this character string is updated to become "**</SECTION>". As a consequence, the coding start character string retrieving unit 105 finds out a coding start character string "</SECTION>" from the tail of the character string stored in the input character string holding unit 103, and then instructs the switch 107 to change the data destination. Until this time, non-compressed data is outputted from the output terminal 131.

Next, a description will now be made of operations when a character is outputted from the terminal S1 of the switch 107. In this case, the following units of the first document managing apparatus will function, namely, the second character string holding unit 102, the context holding unit 104, the coding end character string retrieving unit 106, the code holding unit 108, the coding unit 109, and the code updating unit 110.

The second character string holding unit 102, the context holding unit 104, and the coding end character string retrieving unit 106 may be operated similar to the first character string holding unit 101, the input character string holding unit 103, and the coding start character string retrieving unit 105, respectively.

In other words, the second character string holding unit 102 holds several coding end character strings (<SECTION>, <SUBSECTION> etc.) selected from the end tag. The context holding unit 104 is capable of holding a character string having the same length as the longest coding end character string held by the second character string holding unit 102, and updates the content of the internally held character string based on the character supplied from the terminal S1. Also, the context holding unit 104 supplies a character string (context) constructed of a preselected number of characters provided on the tail side to the code holding unit 108.

Every time a new character is inputted into the context holding unit 104, the coding end character string retrieving unit 106 judges as to whether or not such a character string is present at the tail of the character string in the context holding unit 102, which is coincident with any of the coding end character strings held in the second character string holding unit 102. In the case that there is no character string coincident with the coding end character string, the coding end character string retrieving unit 106 executes no operation, but waits for an entry of the next character. On the other hand, when there is such a character string coincident with any of the coding end character strings, the coding end character string retrieving unit 106 switches the data destination of the switch 107 from the terminal S2 to the terminal S1.

The code holding unit 108, the coding unit 109, and the code updating unit 110 dynamically code the characters sequentially supplied from the terminal S1. The respective units are operated as follows.

That is, the code holding unit 108 holds a code table used in the coding operation with respect to each context, and refers to the code table corresponding to the context notified from the context holding unit 104, which code table will be updated. The coding unit 109 determines a code corresponding to the character inputted from the terminal S1 by employing the code table to be searched/updated by the code holding unit 108. Then, the coding unit 109 outputs the determined code (compressed data) from the output terminal 131. This compressed data is continuously outputted for a time period until the switch 107 is switched from this terminal S1 to the other terminal S2. When the character coding operation is ended, the code updating unit 110 updates the content of the code table used in the character coding operation in order to reflect that the appearing frequency of this character is increased to the relationship between the character and the code.

Figure 3:
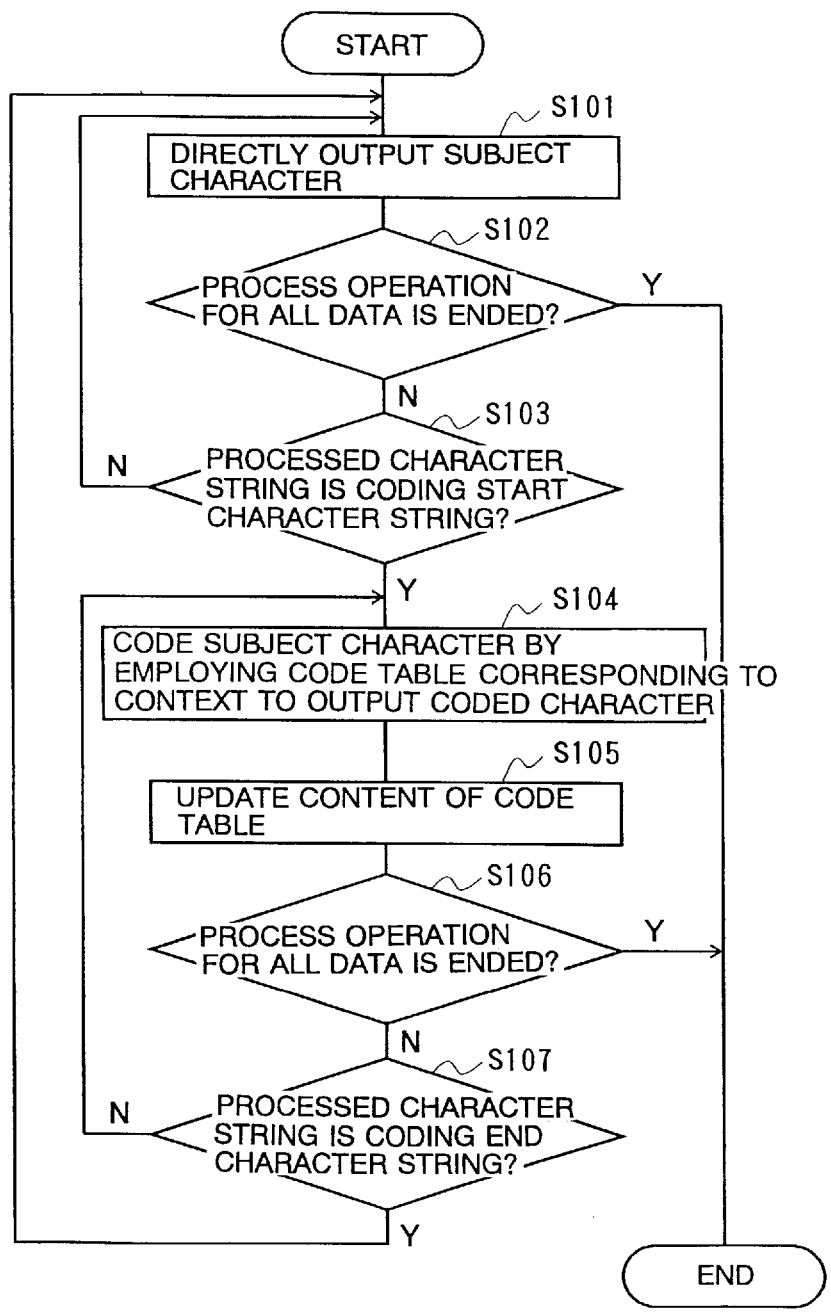
FIG. 3 is a flow chart for describing the compressed document file forming sequence executed by the document managing apparatus of the first embodiment of the present invention.

Referring now to FIGS. 3–5, a detailed explanation will be made of the sequential operation to form the compressed document file by the document managing apparatus according to the first embodiment of the present invention. That is, FIG. 3 is a flow chart for describing the sequential operation to form the compressed document file by the data processing apparatus 14. FIG. 4 schematically represents one example of document data to be compressed in this first document managing apparatus. FIG. 5 schematically shows a summary of the compressed document file formed by this first document managing apparatus based upon the document data shown in FIG. 4. It is assumed in the below-mentioned description that "</SECTION>" and "</SUBSECTION>" are set as the coding start character strings, and "<SECTION>" and "<SUBSECTION>" are set as the coding end character strings.

To form the compressed document file, a non-compressed data output process loop for directly outputting the respective characters which constitute the document data, and a compressed data output process loop for compressing the respective characters to output the compressed characters are alternately repeated. As indicated in FIG. 3, when an instruction is issued to compress the document data, the non-compressed data output process loop (steps S101 to S103) is performed in the data processing apparatus 14.

In this non-compressed data output process loop, one character (character to be processed) in the document data is directly outputted from the terminal S2 side of FIG. 2 to thereby be written into the compressed document file (step S101). Next, a judgment is made as to whether or not the process operation is complete with respect to all characters for constituting the document data (step S102). Then, when the process operation for all of the characters is not ended ("N" at step S102), another judgment is made as to whether or not the character string which has been processed so far is coincident with any of the coding start character strings (step S103).

In such a case that the processed character string is not coincident with the respective coding start character strings ("N" at step S103), the process operation defined from the above-described step S101 is again executed. On the other hand, when the character string which has been processed so far is coincident with one of the coding start character strings ("Y" at step S103), the compressed data output process loop (steps S104 to S107) is commenced.

For instance, when the compressed document file related to the document data shown in FIG. 4 is formed, the first appearing coding start character string is "</SECTION>" (second line). As a result, the respective characters from the head of this document data to the coding start character string "</SECTION>" in the second line are directly outputted so as to be stored in the compressed document file. As a consequence, the data having the same content as the document data is stored in the head portion of the compressed document file, as illustrated in FIG. 5. Then, the compressed data output process operation is commenced for the character subsequent to this coding start character string "</SECTION>".

Referring back to FIG. 3, the description of the compressed document file forming process will now be continued.

In the compressed data output process loop, next one character is read out from the document data on the terminal S1 side, and a code corresponding to this subject character is outputted from the coding unit (step S104). At this step S104, the corresponding code is outputted while referring to the context of this character. Thereafter, the content of the code table related to the context used in the coding operation is updated (step S105).

Next, a judgment is made as to whether or not the process operation is complete with respect to all characters constituting the document data. Then, if the process operation for all of the characters is not ended ("N" at step S106), another judgment is made as to whether or not the character string which is made of several characters is coincident with any of the coding end character strings (step S107).

In such a case that the coded character string constructed of the several characters is not coincident with all of the coding end character strings ("N" at step S107), the process operation defined from the above-described step S104 is again executed. On the other hand, when the coded character string which is made of several characters is coincident with one of the coding end character strings ("Y" at step S107), the non-compressed data output process loop (steps S101 to S103) is again commenced.

For instance, in the document data shown in FIG. 4, a first appearing coding end character string after the third line is "<SECTION>" (fourth line). As a consequence, the respective characters from the beginning of the third line up to the coding end character string "<SECTION>" in the fourth line are encoded to output the coded characters. As a result, the respective characters of this portion are stored as compressed data into the compressed document file, was shown in the third line of FIG. 5. Then, the process operations defined by the non-compressed data output process loop and the compressed data output process loop are again repeated with respect to a sentence (2. SCOPE OF CLAIM FOR A PATENT </SECTION> - - - ) from the next character of "<SECTION>". Eventually, a compressed document file is formed in such a manner that only the portion sandwiched by the coding end character string and the control character string designated as the coding start character string is non-compressed, and other portions (containing other control character strings such as <PARAGRAPH>, <TT>) are compressed.

This compressed document file forming process is accomplished either when the process operation for all of the data is ended in the non-compressed data output process loop ("Y" at step S102) or when the process operation for all of the data is ended in the compressed data output process loop ("Y" at step S106).

Figure 6:
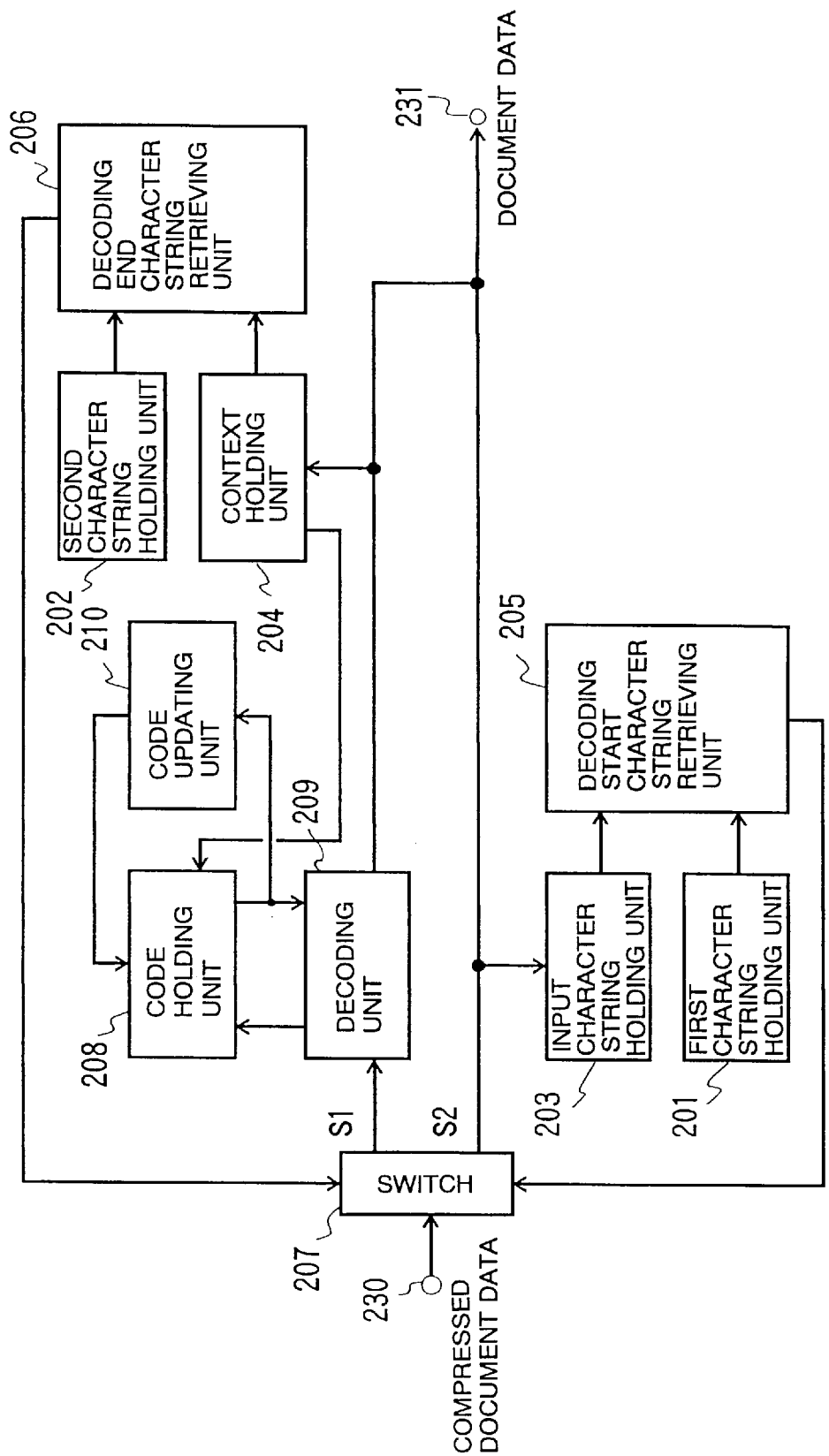
FIG. 6 is a functional block diagram for explaining decompressing operation by the document managing apparatus according to the first embodiment of the present invention.

With reference to the functional block diagram shown in FIG. 6, a description will now be made of operations to restore a compressed document file by the document managing apparatus (data processing apparatus 14) of the first embodiment.

The data constituting the compressed document file is supplied from an input terminal 230 to a switch 207. The switch 207 outputs an inputted character from either terminal S1 terminal S2.

The following descriptions are made of operations of the various units when the switch 207 is operated to supply the data to the terminal S2. It should be noted that the decompressing operation of the compressed document file is commenced under such a condition that the data is outputted from the terminal S2 of the switch 207.

When the data is supplied from the terminal S2 of the switch 207, an input character string holding unit 203, a first character string holding unit 201, and a decoding start character string retrieving unit 205 may function. The data derived from the terminal S2 of the switch 207 is outputted from the output terminal 231 as a single character contained in the document data, and also is supplied to the input character string holding unit 203.

The input character string holding unit 203 holds a character string constituted by N1 characters at maximum, and updates the content of the internally held character strings based on the character supplied from the terminal S2. The first character string holding unit 201 holds the same character string (<SECTION>, </SUBSECTION> etc.) as the coding start character string held by the first character string holding unit 201 as a decoding start character string. Every time new data (character) is inputted into the input character holding unit 203, the decoding start character string retrieving unit 205 judges as to whether or not such a character string is present at the tail of the character string in the input character holding unit 203, which is coincident with any of the decoding start character strings held in the first character string holding unit 201. If there is no character string coincident with the decoding start character string, the decoding start character string retrieving unit 205 executes no operation, but waits for an entry of the next data. On the other hand, when there is a character string coincident with any of the decoding start character strings, since the subsequent character strings are compressed, the decoding process is required. As a consequence, the decoding start character string retrieving unit 205 switches the data destination of the switch 207 from the terminal S2 to the terminal S1.

Next, operations when the data (code) is outputted from the terminal S1 of the switch 207 will now be described. In this case, a code holding unit 208, a decoding unit 209, a code updating unit 210, a second character string holding unit 202, a context holding unit 204, and also a coding end character string retrieving unit 206 start their functions.

The code holding unit 208, the decoding unit 209, and the code updating unit 210 adaptively decode the data (codes) sequentially supplied from the terminal S1. The respective units are operated as follows.

That is, the code holding unit 208 holds a code table used in the decoding operation with respect to each context, and refers to the code table corresponding to the context notified from a context holding unit 204 (will be discussed later) which code table will be updated. The decoding unit 209 decodes the code inputted from the terminal S1 by employing the code table to be searched/updated by the code holding unit 208. Then, a character corresponding to the decoded result is supplied to the output terminal 231 and the context holding unit 204. After the decoding operation is ended by the decoding unit 209, the code updating unit 210 updates the content of the code table used in the decoding operation in order to reflect that the appearing frequency of this character corresponding to the decoded result is increased to the relationship between the character and the code.

The context holding unit 204 has the capability to hold a character string constructed of N2 pieces of characters, and updates the content of the character string held therein based upon a character supplied from the decoding unit 209. The context holding unit 204 supplies a character string constituted by a preselected number of characters located on the tail side of the held character strings to the code holding unit 208 as a context. The second character string holding unit 202 holds the same character string as the coding end character string held by the second character string holding unit 102 (see FIG. 2) as a decoding end character string. It should be noted that symbol "N2" indicates the quantity of the characters contained in the longest decoding end character string held in the second character string holding unit 202.

The decoding end character string retrieving unit 206 judges as to whether or not there is a character string coincident with any of the decoding end character strings held in the second character string holding unit 202 at the tail of the character strings held in the context holding unit 204 every time a character is newly inputted into the context holding unit 204. Then, where there is no character string coincident with the decoding end character string, the decoding end character string retrieving unit 206 performs no retrieving operation, and waits for an entry of the next decode result. On the other hand, when there is a character string coincident with the decoding end character string, since a character string subsequent to this coincident character string corresponds to the non-compressed character string, the decoding end character string retrieving unit 206 switches the data destination of the switch 207 from the terminal S1 to the terminal S2.

Referring now to FIG. 4 and FIG. 5 which have been employed so as to explain the sequential operation to form the compressed document file, the sequential operation to restore the compressed document file by the document managing apparatus according to the first embodiment will now be described. It should be noted that FIG. 7 is a flow chart for describing the sequential operation to restore the compressed document file by the data processing apparatus 14.

Figure 7:
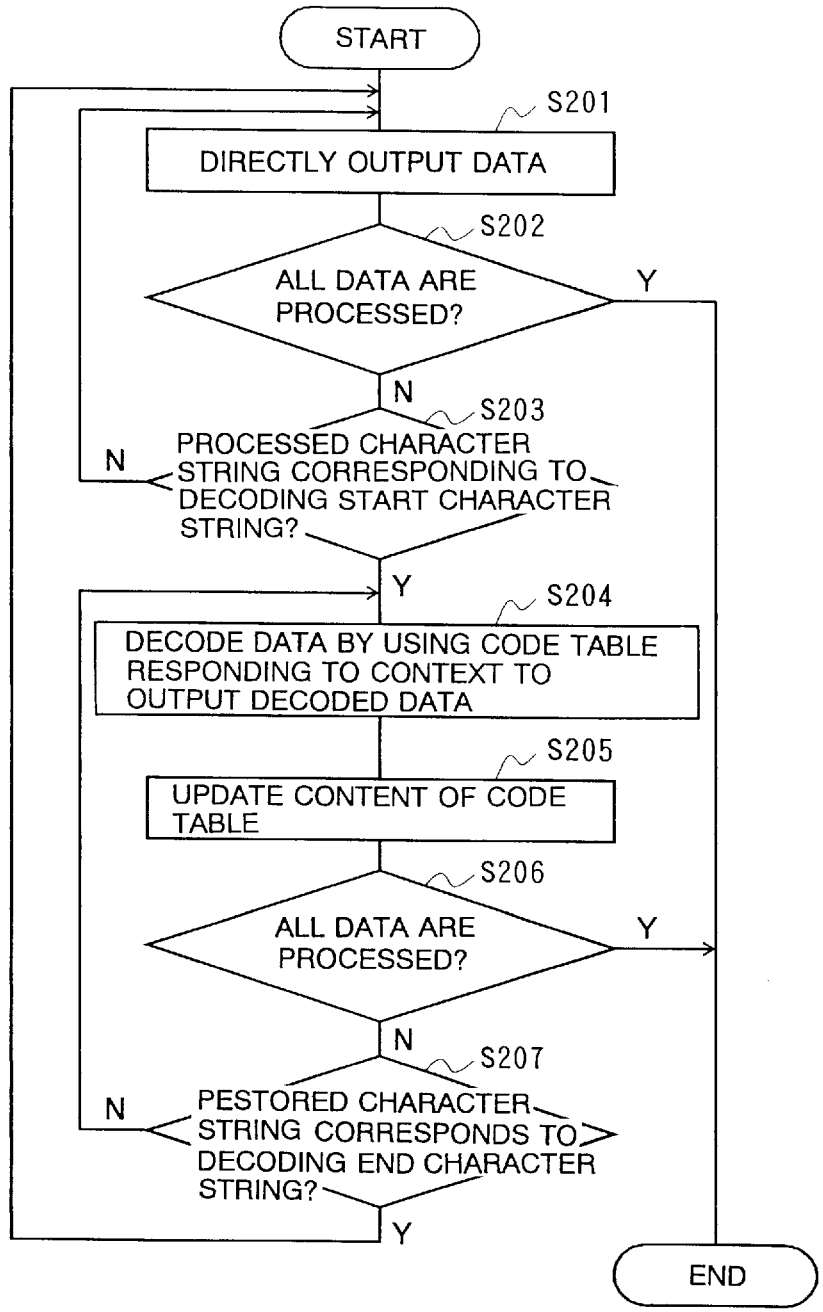
FIG. 7 is a flow chart for describing a sequence to restore a compressed document file executed by the document managing apparatus according to the first embodiment of the present invention.

As indicated in FIG. 7, when the decompressing operation of the compressed document file is first instructed, a non-compressed data process loop (steps S201 to S203) is executed in the data processing apparatus 14. In this non-compressed data process loop, data about a first character stored in the compressed document file is directly outputted as a restored result (step S201). Subsequently, a check is made as to whether or not the process operation has been accomplished for all of the data stored in the compressed document file (step S202). Then, if the process operation is not yet ended for all of these data ("N" at step S202), another check is done as to whether or not a character string arranged by several outputted characters is coincident with any of the decoding start character strings (step S203).

When the character string arranged by the several outputted characters is not coincident with each of the decoding start character string ("N" at step S203), the process operation defined from the step S201 is again executed. To the contrary, when the character string arranged by the several outputted characters is coincident with one of the decoding start character strings ("Y" at step S203), the compressed data process loop (steps S204 to S207) is commenced.

For example, in the case that the compressed document file shown in FIG. 5 is to be processed, a decoding start character string first found in the non-compressed data process loop is "</SECTION>" (second line). Accordingly, the respective characters up to this decoding start character string "</SECTION>" are directly outputted, so that the two-line data at the head portion of FIG. 4 is produced. The process operation by the compressed data process loop is commenced for the data subsequent to this decoding start character string "</SECTION>".

Referring back to FIG. 7, the decompressing process operation of the compressed document file will now be explained.

In this compressed document process loop, a necessary amount of data (codes) of the compressed document file is read, and then characters corresponding to the decoded result of the codes are outputted (step S204). It should be understood that this decoding operation is carried out, while referring to the character strings (context) which have already been decoded. Thereafter, the content of the code table related to the context used in the decoding operation is updated (step S205).

Next, a check is made as to whether or not the process operation has been accomplished for all of the data stored in the compressed document file (step S206). Then, when the process operation is not yet ended for all of these data ("N" at step S206), another check is done as to whether or not a character string arranged by several decoded characters is coincident with any of the decoding end character strings (step S207).

When the character string arranged by the several decoded characters is not coincident with each of the decoding end character string ("N" at step S207), the process operation defined from the step S204 is again executed. To the contrary, when the character string arranged by the several decoded characters is coincident with one of the decoding start character strings ("Y" at step S207), the non-compressed data process loop (steps S201 to S203) is again performed.

For example, in the case that the compressed data from the third line at FIG. 5 are sequentially decoded, such a character string "<SECTION>" will be restored soon. When the character string coincident with one of the decoding end character strings is restored in this manner, the data processing apparatus 14 escapes from the compressed data process loop, and starts the non-compressed data process loop. It should be noted that when the process operation for all of the data in the non-compressed data process loop is accomplished ("Y" at step S202), or when the process operation for all of the data in the compressed data process loop is complete ("Y" at step S206), the data processing apparatus 14 accomplishes the process operation to restore the compressed document file.

As previously described in detail, the compressed document file in which a portion of the document data has been directly stored without any compression is formed based upon the document data in the document managing apparatus according to the first embodiment of the present invention. In other words, the compressed document file is formed which can be retrieved based on the keyword. Accordingly, in accordance with this first do managing apparatus, the content of the compressed document file can be predicted, or confirmed without actually decompressing this compressed document file.

It should also be noted that although this document managing apparatus of the first embodiment has been arranged as the apparatus capable of managing the SGML-formatted document data, this first document managing apparatus may be utilized as an apparatus capable of managing data in other formats (not limited to document data) by merely changing control character strings stored therein. Also, it is possible to employ not only the control character strings, but also control characters.

On the other hand, when the compressed document file managed by the document managing apparatus according to the first embodiment is retrieved based on "<" or ">" corresponding to a constructive element of the tag rather than the tag unit, there are certain possibilities that a code contained in the compressed data is retrieved. To avoid such an erroneous retrieval, the first document managing apparatus may have a retrieving function such that when a non-character code exists subsequent to the retrieved character, this retrieved character is neglected and then the retrieving operation is further continued. In order to firmly actuate this retrieving mechanism, when "0x3c" (namely, ASCII code of "<") and "0x3e" (namely, ASCII code of ">") appear in the compressed data constituting the compressed document file, a specific code corresponding to a non-ASCII code such as "0x0o", may be inserted subsequent to the first-mentioned codes. It should be understood that when this first document managing apparatus is arranged in this manner, this specific code should be removed during the decompressing operation of the compressed document file.

OPERATIONS OF SECOND DOCUMENT MANAGING APPARATUS

The above-described document managing apparatus of the first embodiment is an apparatus for forming the compressed document file in which the data contained in the document data is directly used as the non-compressed data. In contrast, a document managing apparatus according to a second embodiment is an apparatus for forming a compressed document file which stores therein data which is produced by substituting the data contained in the document data in accordance with a predetermined rule. The first-mentioned data is not equal to the data contained in this document data. In other words, the second document managing apparatus forms the compressed document data in which the directly readable data is not contained. Since sequential operations of the document managing apparatus according to the second embodiment mode are similar to those of the first embodiment mode, only different operations will now be explained.

Figure 8:
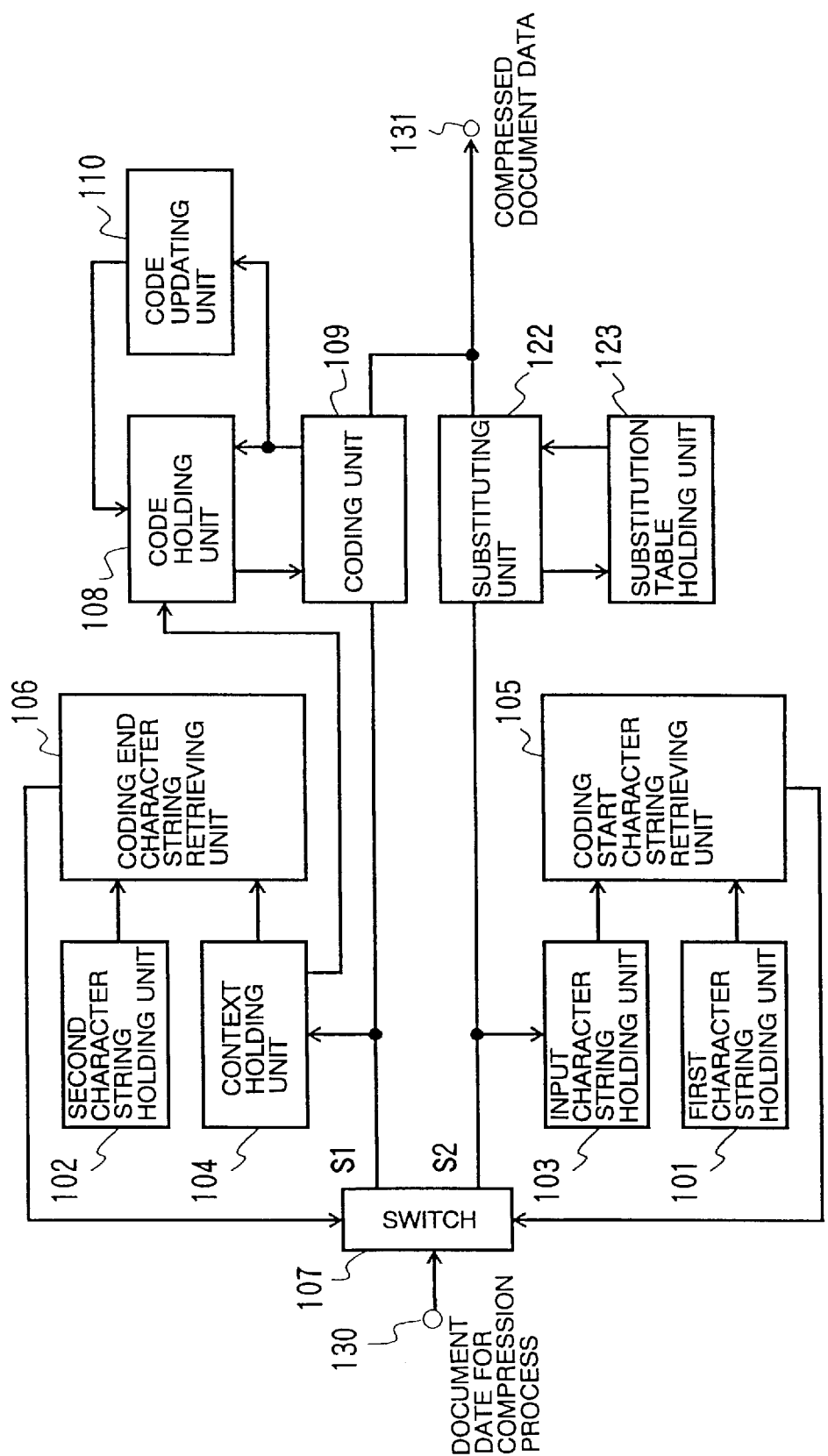
FIG. 8 is a functional block diagram for explaining a sequence to form a document file by a document managing apparatus according to a second embodiment of the present invention.
Figure 9:
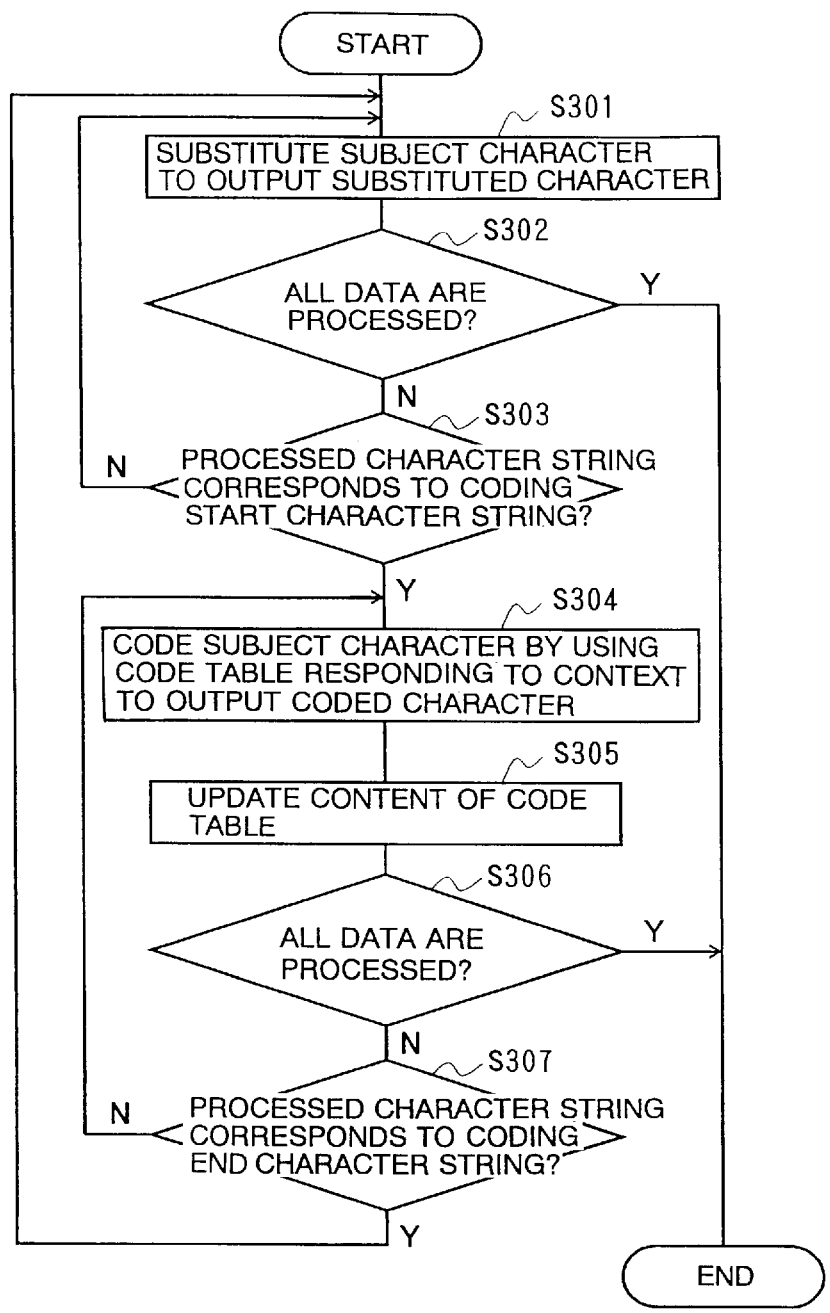
FIG. 9 is a flow chart for describing the sequence to form the compressed document file executed by the document managing apparatus according to the second embodiment of the present invention.

First, a sequential operation to form a compressed document file by the document managing apparatus according to the second embodiment mode will now be explained with reference to FIG. 8 and FIG. 9. FIG. 8 is a functional block diagram used to describe the compressed document file forming sequential operation in the document managing apparatus according to the second embodiment. FIG. 9 is a flow chart for explaining this compressed document file forming sequential operation.

As represented in FIG. 8, data (namely, non-compressed character to be processed) derived from the terminal S2 of the switch 107 is supplied to a substituting unit 122, and an output from the substituting unit 122 is stored in a compressed document file in the document managing apparatus according to the second embodiment.

A substituting table holding unit 123 is connected to the substitution unit 122 which holds a substitution table in which characters correspond to substituted characters. The substituting unit 122 outputs a character corresponding to the character supplied from the terminal S2 in this substitution table.

That is, in the document managing apparatus of the second embodiment, as shown in FIG. 9, when a character is outputted in the non-compressed data output process loop (steps S301 to S303), the character contained in the document data is substituted and the substituted character is outputted (step S301).

Therefore, there is no data which can be directly read in the compressed document file formed by the document managing apparatus according to the second embodiment. For instance, a file is transferred through a plurality of machines in a relay manner in an internet system. When document data is transferred in this compressed document file format, it is possible to prevent the content of this document file from being read by the illegal machines.

It should also be noted that when an instruction is issued to retrieve a compressed document file by a keyword, the document managing apparatus according to the second embodiment is arranged in such a manner that the retrieving operation is performed based on such a keyword obtained by substituting the first-mentioned keyword by using the substitution table.

Figure 10:
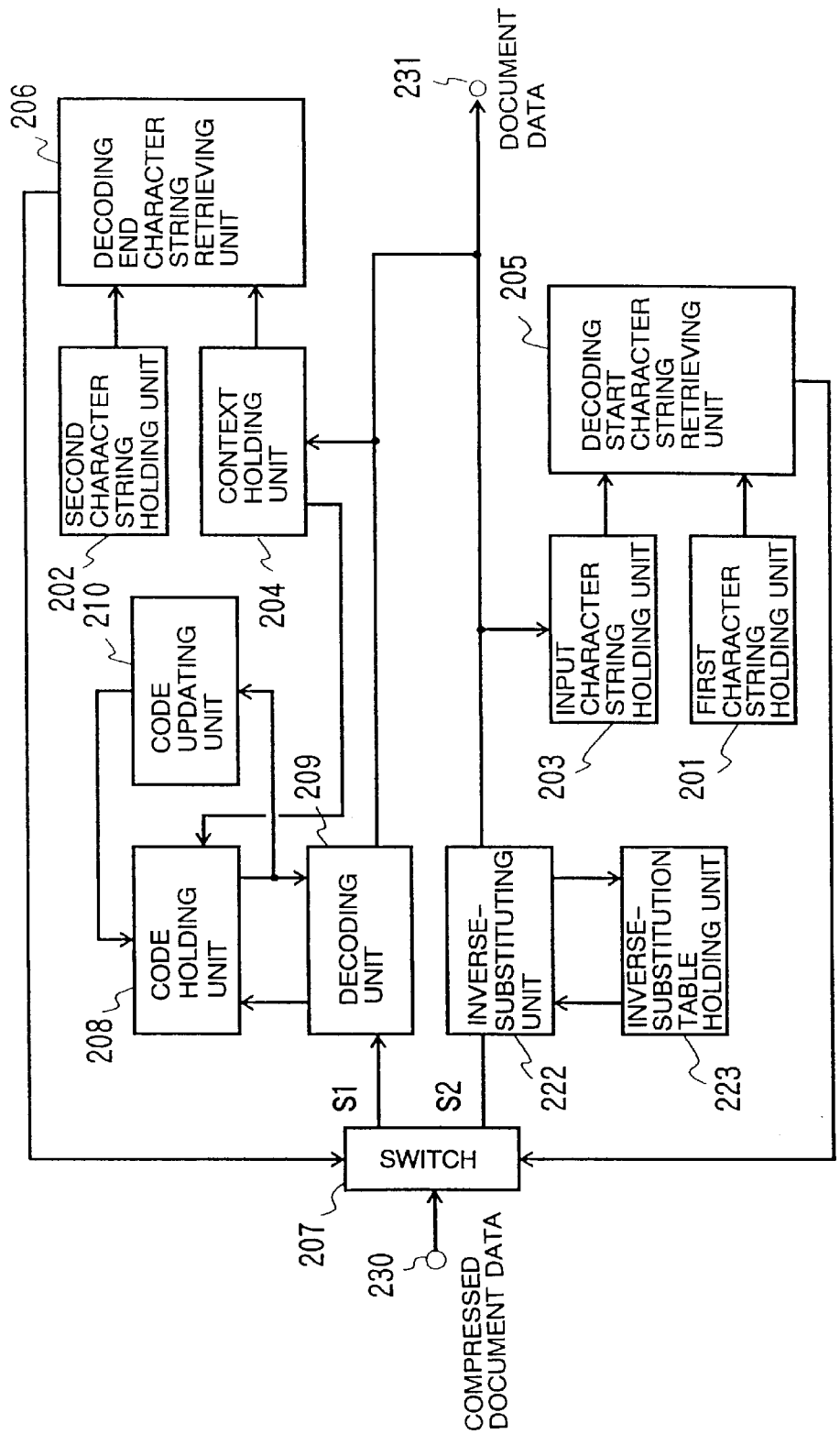
FIG. 10 is a functional block diagram for explaining a sequence to restore the compressed document by the document managing apparatus according to the second embodiment of the present invention.
Figure 11:
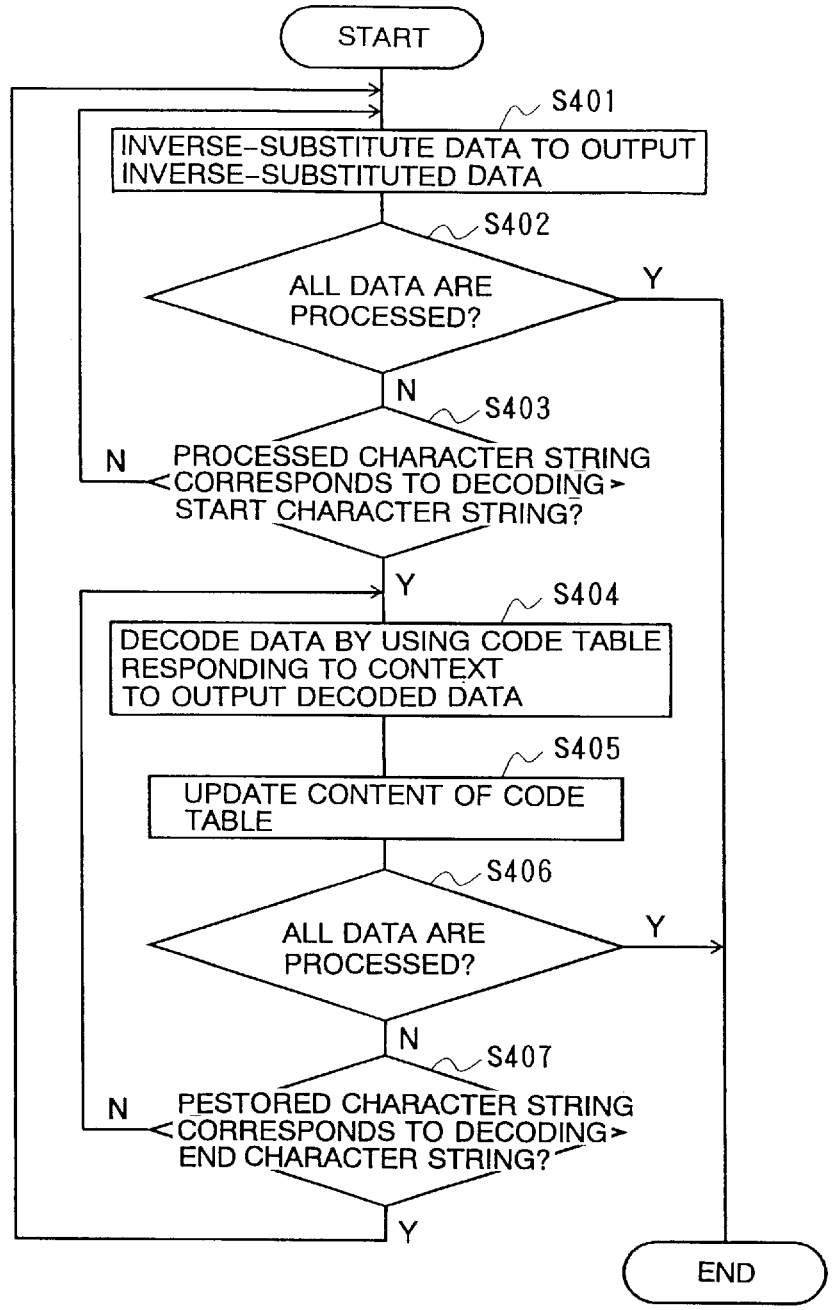
FIG. 11 is a flow chart for describing the sequence to restore the compressed document file executed by the document managing apparatus according to the second embodiment of the present invention.

Next, a sequential operation to restore a compressed document file by the document managing apparatus according to the second embodiment mode will now be explained with reference to FIG. 10 and FIG. 11. FIG. 10 is a functional block diagram used to describe the compressed document file decompressing sequential operation in the document managing apparatus according to the second embodiment. FIG. 11 is a flow chart for explaining this compressed document file decompressing sequential operation.

As represented in FIG. 10, data (namely, character) derived from the terminal S2 of the switch 107 is supplied to an inverse-substituting unit 222, and an output from the inverse-substituting unit 222 is added to the document data obtained by decompressing a compressed document file in the document managing apparatus according to the second embodiment.

An inverse-substituting table holding unit 223 is connected to the inverse-substituting unit 222 which holds an inverse-substitution table corresponding to the substitution table in the substitution table holding unit 123. The inverse-substituting unit 222 outputs a character corresponding to the character supplied from the terminal S2 in this inverse-substitution table.

That is, in the document managing apparatus of the second embodiment, as shown in FIG. 11, in the non-compressed data output process loop (steps S401 to S403), the character is outputted which is produced by inverse-substituting the data (character) contained in the non-compressed document file (step S401).

OPERATIONS OF THIRD DOCUMENT MANAGING APPARATUS

A document managing apparatus according to a third embodiment of the present invention is constructed based upon the above-described document managing apparatus of the third embodiment. It should be noted that when a compressed document file in which non-compressed data is mixed with compressed data is formed in the document managing apparatus according to the third embodiment, an index file arranged by only the non-compressed data is also formed. Furthermore, a format of this compressed document file is different from that of the compressed document file formed in the document managing apparatus of the first embodiment. In addition, a unit for performing a decompressing operation by utilizing the index file may be designated in the document managing apparatus of the third embodiment.

Figure 12:
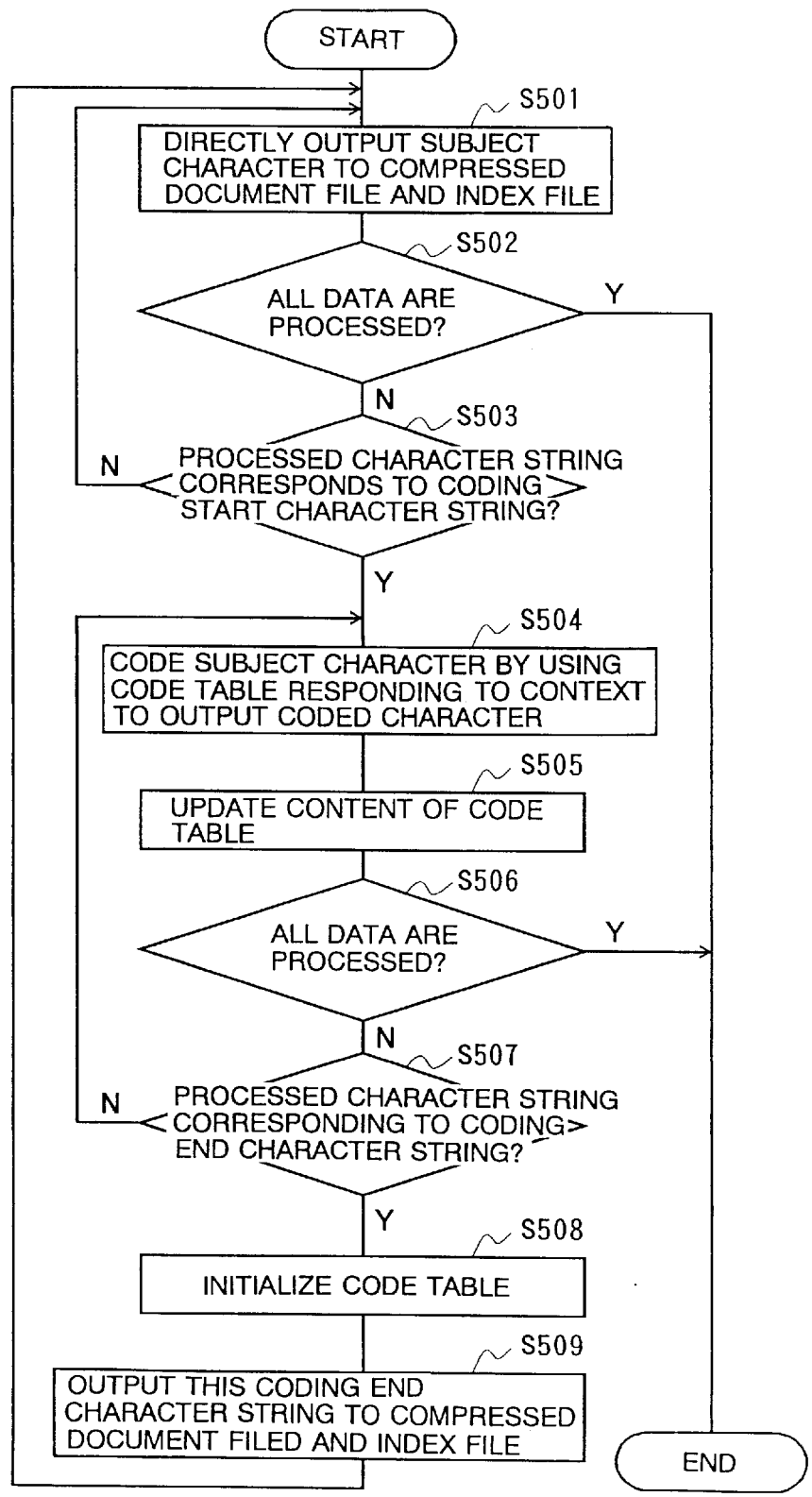
FIG. 12 is a flow chart for describing a sequence to form a compressed document file by an apparatus according to a third embodiment of the present invention.

Referring now to FIG. 12, a description will be firstly made of a compressed document file forming sequence by the document managing apparatus (data processing apparatus) according to the third embodiment.

When a first instruction is issued to compress document data, a non-compressed data output process loop (steps S501 to S503) is commenced in the data processing apparatus. In this non-compressed data output process loop, one character (character to be processed) in the document data is firstly and directly outputted to thereby be written into the compressed document file and the index file (step S501). Next, a judgment is made as to whether or not the process operation is complete with respect to all characters for constituting the document data (step S502). Then, if characters to be processed are left ("N" at step S502), a check is made as to whether or not a character string which is constructed of the several processed characters and contains the processed characters at this time is coincident with one of predetermined coding start character strings (step S503).

In such a case that there is no coding start character string coincident with the processed character strings ("N" at step S503), the process operation defined from the above-described step S501 is again executed. On the other hand, when the character string has been processed which is coincident with one of the coding start character strings ("Y" at step S503), a compressed data output process loop (steps S504 to S507) is commenced.

In the compressed data output process loop, a subsequent character is read out from the document data, and then a code corresponding to this subject character is outputted (step S504). This code is outputted at this step while referring to a context of this subject character. Thereafter, the content of the code table related to the context employed in the coding operation is updated (step S505).

Next, a judgment is made as to whether or not the process operation is complete with respect to all characters constituting the document data (step S506). Then, when characters to be processed are left ("N" at step S506), another judgment is made as to whether or not the character string containing the characters which have been processed so far is coincident with any of the coding end character strings (step S507). In such a case that the processed character string is not coincident with the respective coding end character strings ("N" at step S507), the process operation defined from the above-described step S504 is again executed.

On the other hand, when the character string which has been so far processed is coincident with one of the coding end character strings ("Y" at step S507), the code table is initialized (step S508). Thereafter, the coding end character string detected at step S507 is outputted to the compressed document file and the index file (step S509), and then the non-compressed data output process loop (step S501 to S503) is again commenced.

This compressed document file forming process operation is accomplished when the detection is made that the process operation for all of the data is complete in the non-compressed data output process loop ("Y" at step S502), or when the detection is made that the process operation for all of the data is complete in the compressed data output process loop ("Y" at step S506).

The compressed document file forming sequential operation by the document managing apparatus according to the third embodiment will now be described in more detail, while using such an example that the document data shown in FIG. 4 is processed. It is assumed in the following description that "</SECTION>" and "</SUBSECTION>" are set as the coding start character strings, whereas "<SECTION>" and "<SUBSECTION>" are set as the coding end character strings.

In this case, since the first appearing coding start character string is "</SECTION>" (second line), the respective characters defined from the head data of the document data up to "</SECTION>" in the second line are processed in the non-compressed data output process loop. Then, the characters succeeding the coding start character string "</SECTION>" are processed by the compressed data output process loop. After the compressed data output process loop is commenced, a first appearing coding end character string is "<SECTION>" (fourth line). As a result, the respective characters defined from the beginning of the third line until the coding end character string "<SECTION>" of the fourth line are encoded and then the coded characters are outputted. Then, when the coding operation for ">" contained in the coding end character string "<SECTION>" is accomplished, the coding table is initialized, and the coding end character string "<SECTION>" is written into the compressed document file and the index file.

A series of the above-described operation is repeatedly performed for the respective data stored in the compressed document file, so that a compressed document file and an index file are formed as shown in FIG. 13 and FIG. 14, respectively, in the document managing apparatus of the third embodiment.

That is, the compressed document file formed by the third document managing apparatus stores the non-compressed data produced by adding the coding end character string (start tag) to each of the non-compressed data stored in the compressed document file (FIG. 5) formed by the first document managing apparatus. Then, data identical to the non-compressed data stored in the compressed document file is stored in the index file. When the compressed data output process loop is ended, the code table is initialized, so that the respective compressed data stored in the compressed document file can be solely restored.

A detailed description will now be made of an index corresponding region decompressing process which corresponds to such a process operation for decompressing only a designated content range of the compressed document file.

Figure 15:
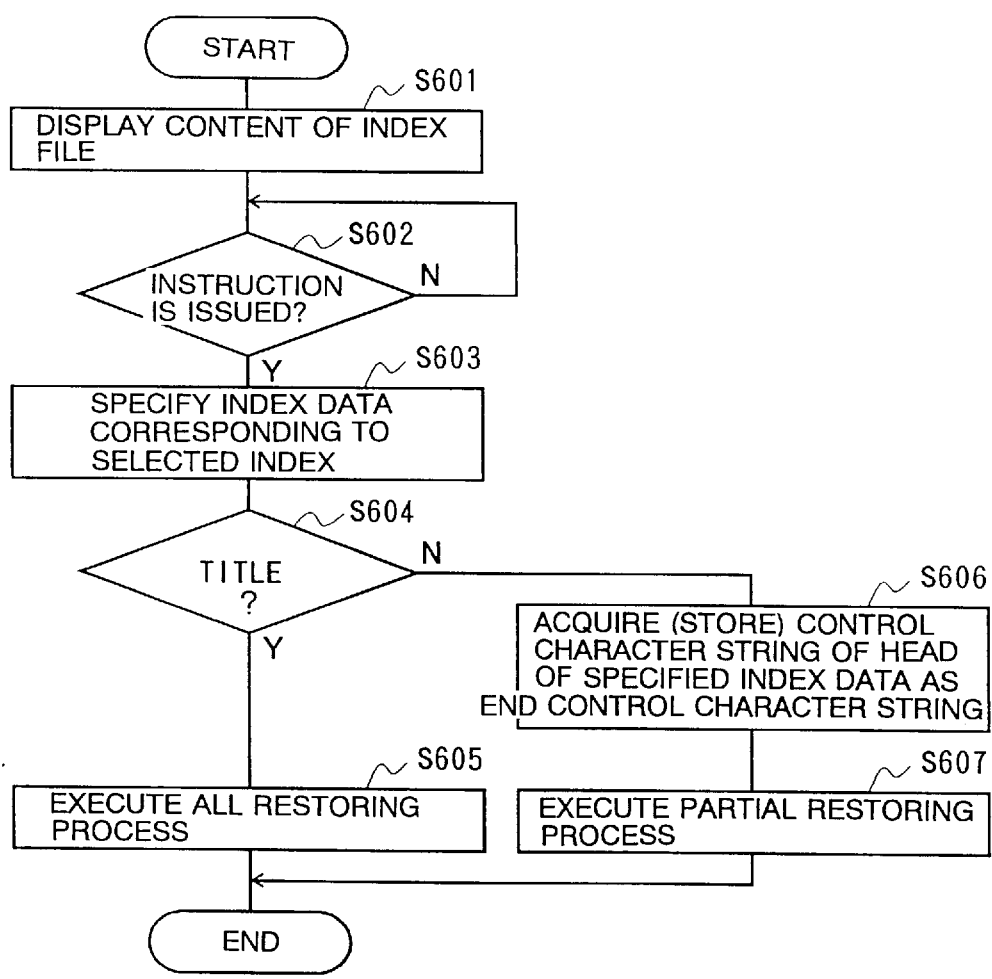
FIG. 15 is a flow chart for describing a process to restore an index corresponding region executed in the document managing apparatus according to the third embodiment of the present invention.

In FIG. 15, there is shown an operation sequence of the document managing apparatus (data processing apparatus) during the index corresponding range decompressing process. It should be noted that the flow opera ion shown in FIG. 15 is commenced when a predetermined instruction containing specific information about document data is issued from a user.

As represented in this drawing, upon receipt of a predetermined instruction issued from the user, the document managing apparatus (data processing apparatus) displays the content of the index file in correspondence with the document data designated by this instruction on the display apparatus (step S601). It should be noted that the data processing apparatus displays only such data (referred to as an "index" hereinafter) sandwiched by the starting tag and the end tag and stored in the index file on the display apparatus. For example, in the case that the document data corresponding to the index file shown in FIG. 14 has been designated for the process operation, data as represented in FIG. 16 is displayed on the display apparatus.

Thereafter, the operation state of the data processing apparatus is advanced to a state of waiting for an instruction issued from the user (step S602). At step S602, the data processing apparatus waits for the process operation for designating the index to be outputted on the screen, namely clicking a mouse, and thus, the user manipulates the mouse in order to instruct the process operation to be executed by the data processing apparatus. It should be noted that at this step S602, the user may instruct the process operation to display the content of another index file, or to display the content of this index file. However, in this case, a description is made of only operations that the mouse is clicked or when the mouse cursor is positioned on any of the indexes.

If the mouse is clicked the mouse cursor is located on any one of the indexes ("Y" at step S602), the data processing apparatus recognizes that this index is selected, and specifies index data (namely, index sandwiched by the tags) corresponding to the selected index with reference to the index file (step S603).

Then, the data processing apparatus judges whether or not the specified index data is related to "TITLE". If the specified data is related to "TITLE" ("Y" at step S604), an overall decompressing process is executed which corresponds to a process for decompressing all of the contents of the compressed document file corresponding to the subject document data (step S605). Then, the restored result is displayed or stored as a file, so that this process operation is ended.

Figure 17:
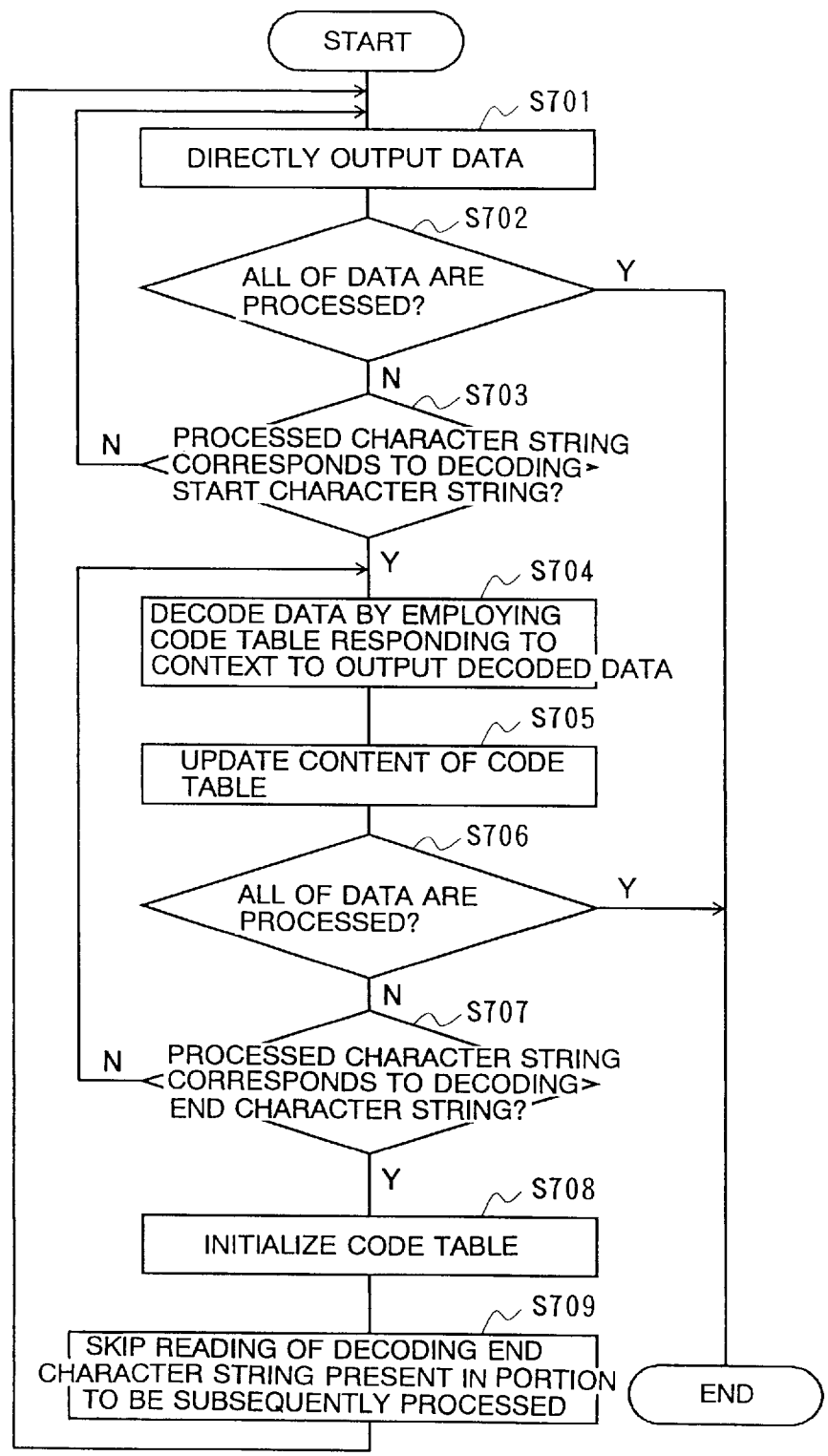
FIG. 17 is a flow chart for describing an entire decompressing process executed in the document managing apparatus according to the third embodiment of the present invention.

FIG. 17 represents an operation sequence of the data processing apparatus when the overall decompressing process operation is carried out. It should be noted that this process operation is also performed when an instruction is issued to restore the compressed document file.

As indicated in FIG. 17, during the overall decompressing process operation, a non-compressed data process loop (steps S701 to S703) is executed in the data processing apparatus. When the non-compressed data process loop is performed, the data processing apparatus first outputs data about a first character stored in the compressed document file as the restored result (step S701). Next, a judgment is made as to whether or not the process operation is complete with respect to all data in the compressed document file (step S702). Then, when data to be processed are left ("N" at step S702), another check is done as to whether or not the processed character string (containing characters processed at this time) is coincident with any of the decoding start character strings (step S703).

In such a case that the processed character string is not coincident with the respective decoding start character strings ("N" at step S703), the process operation defined from the above-described step S701 is again executed. On the other hand, when the character string which has been so far processed is coincident with one of the decoding start character strings ("Y" at step S703), the compressed data output process loop (steps S704 to S707) is commenced.

In the compressed document process loop, the data processing apparatus reads a necessary amount of data (codes) of the compressed document file, and then outputs characters corresponding to the decoded result of the codes (step S704). It should be understood that this decoding operation is carried out, while referring to the character strings (context) which have already been decoded. Thereafter, the content of the code table related to the context used in the decoding operation is updated (step S705). The data processing apparatus checks as to whether or not the process operation has been accomplished for all of the data stored in the compressed document file (step S706). Then, when the data to be processed are left ("N" at step S706), a check is done as to whether or not the decoded character string is coincident with any of the decoding end character strings (step S707). Then, if the decoded character strings is not coincident with any of the decoding end character strings ("N" at step S707), the data processing apparatus commences the process operation defined from the step S704. On the other hand, when the decoded character string is coincident with one of the decoding end character strings ("Y" at step S707), the data processing apparatus initializes the code table related to all of the contexts ("Y" at step S708). Next, the data processing apparatus skips reading of the decoding end character string existing in the head portion of the data to be subsequently processed (step S709). In other words, the data processing apparatus skips reading of the coding end character string which has been added when the compressed document file is formed. Thereafter, the data processing apparatus commences the non-compressed data process loop (steps S701 to S703).

When such an operation has been performed for all of the data stored in the compressed document file by the data processing apparatus ("Y" at step S706), the overall decompressing processing operation is complete.

Referring back to FIG. 15, the explanation about the index corresponding region decompressing process is continued.

When the index data does not correspond to "TITLE" ("N" at step S604), the data processing apparatus acquires (stores) a head tag of this index data as an end control character string (step S606). Then, a partial decompressing process is executed which corresponds to a process operation for decompressing only data related to the selected index among the content of the compressed document file (step S607). Then, this partial decompressing process is accomplished.

Figure 18:
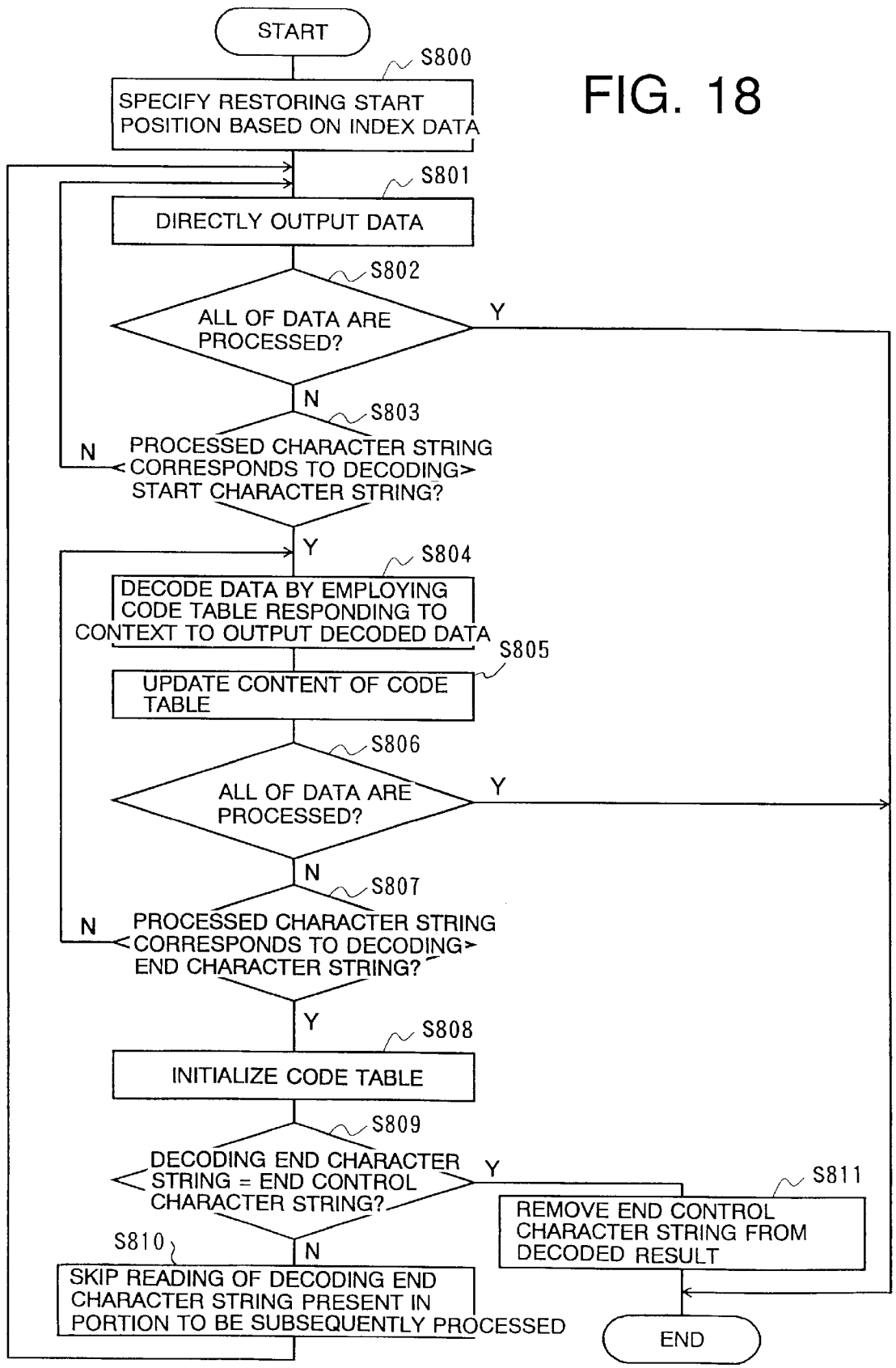
FIG. 18 is a flow chart for describing a partial decompressing process executed in the document managing apparatus according to the third embodiment of the present invention.

FIG. 18 is a flow chart for describing operations of the data processing apparatus during the execution of the partial decompressing process. The overall flow operation of this partial decompressing process is the same as the overall decompressing process (FIG. 17), but only a starting condition and an end condition are different from those of the overall decompressing process. Accordingly, in this case, only different process operation will now be explained.

In the overall decompressing process operation, the decompressing process operation is commenced for the head data of the compressed document file. To the contrary, in the partial decompressing process operation, a restore starting position is first specified based on the index data (step S800). That is, index data is retrieved in response to an index selected from the compressed document file, and then a first character of the retrieved index data is specified as the restore starting position.

Thereafter, the data from this restore starting position will be processed in a sequence similar to that of overall decompressing process.

In the overall decompressing process, when the process operation related to all of the data stored in the compressed document file is complete, this decompressing process is ended. To the contrary, in the partial decompressing process, after the coding table is initialized (step S808), an end judgment is carried out (step S809). Concretely speaking, the data processing apparatus judges as to whether or not the decoding end character string found at the step S807 is coincident with the end control character string stored in this data processing apparatus. Then, when there is no coincidence ("N" at step S809), the data processing apparatus skips reading of a decoding end character string present in a portion to be subsequently processed (step S810), and commences the non-compressed data processing loop.

On the other hand, when the decoding end character string is coincident with the end control character string ("Y" at step S809), the end control character string is removed from the decompressing result (step S811), and then the partial decompressing process is ended.

Now, a more detailed description will be made of the index corresponding region decompressing process with reference to such an example that "2. SCOPE OF CLAIM FOR A PATEN" of FIG. 14 is designated.

In this case, since the corresponding index data is "<SECTION> 2. SCOPE OF CLAIM FOR A PATENT </SECTION>", "<SECTION>" is specified as the end control character string. Next, the decompressing process is commenced from a first character of a character string retrieved from the compressed document file, so that "<SECTION> 2. SCOPE OF CLAIM FOR A PATENT </SECTION>" is processed in the non-compressed data process loop. In the first compressed data process loop executed thereafter, a decoding end character string "<SUBSECTION>" corresponding to the compressed data stored in the compressed document file is restored. However, since this character string is not coincident with the end control character string "<SECTION>", the data processing apparatus continues to restore the compressed document file. Then, when the compressed data process loop is subsequently executed, since "<SECTION>" is restored, the data processing apparatus removes this "<SECTION>" from the restored result, and then completes the partial decompressing process. That is, the decompressing process is carried out for the data portion before the index data of "<SECTION> 2. SCOPE OF CLAIM FOR A PATENT </SECTION>", and then this partial decompressing process is ended.

Figure 19:
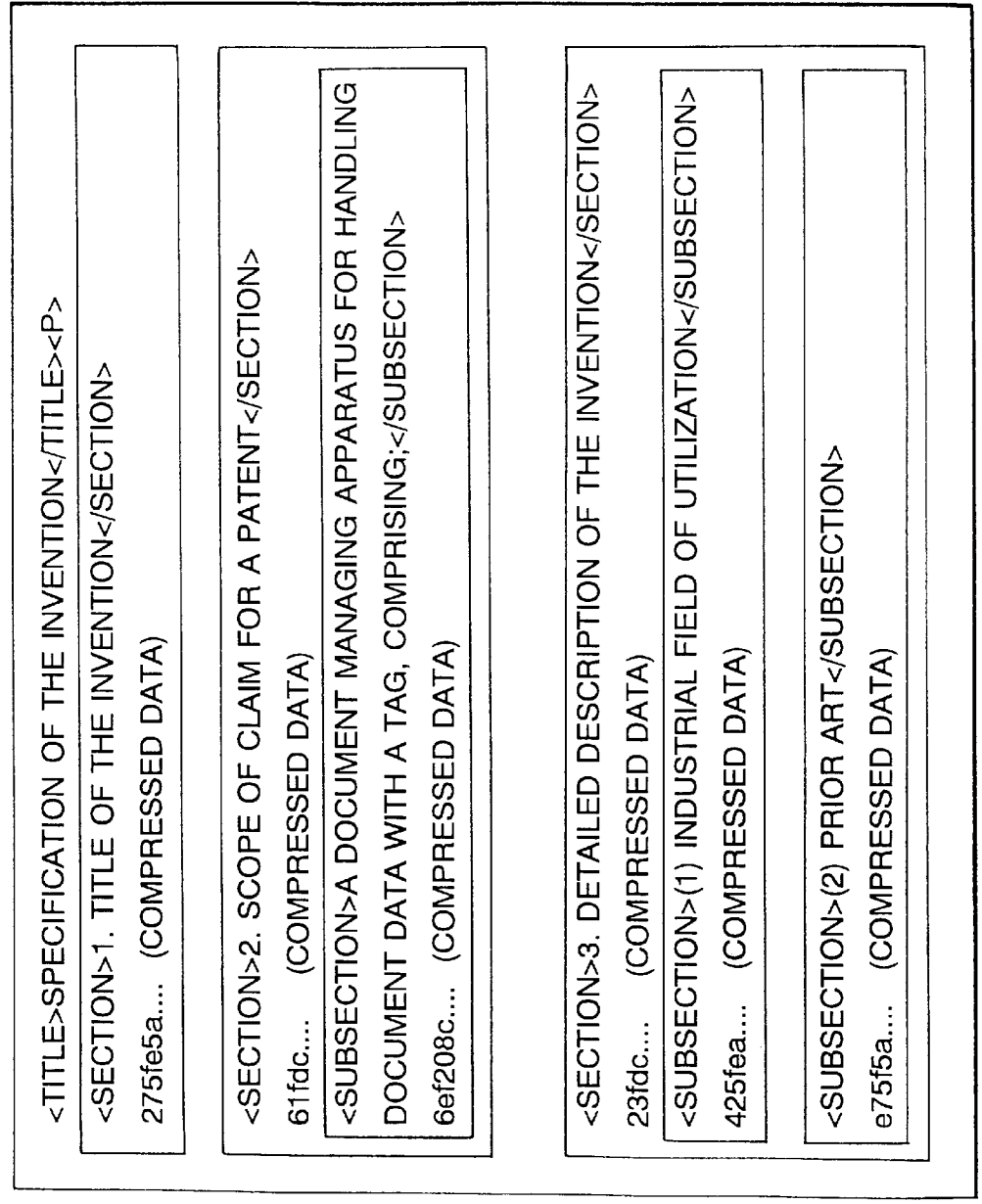
FIG. 19 is an explanatory diagram for explaining a relationship between the index and the region restored in the index corresponding region decompressing process.

Eventually, in the index corresponding region decompressing process, as schematically shown in FIG. 19, the data stored in the region (region surrounded by horizontal rule in FIG. 19) corresponding to the selected index are restored. In other words, when the index related to the "title" is selected, all of the contents are restored, whereas when the index of the subsection is selected, only the data of this selected subsection level is restored. Also, when the index of the section level is selected, all of the data (containing data of subsection level) related to this section are restored.

In accordance with the document managing apparatus of the third embodiment, only a portion of the compressed document file can be restored in the above-described manner.

As described above, the document managing apparatus according to the third embodiment has employed such a sequential operation to add the coding end character string after outputting the compressed data in order to contain the coding end character string (starting tag) in the respective non-compressed data stored in the compressed document file. However, the present invention is not limited to the above-described sequential operation. That is, the third document managing apparatus may be alternatively arranged in such a manner that while several characters among the characters to be processed are buffered, the coding operation is performed for the character which could be defined as being not equal to a portion of a starting tag. The starting tag may be contained in each of the non-compressed data stored in the compressed document file. It should be understood that when the third document managing apparatus is arranged in the above-described manner, the decoding operation is performed with respect to the compressed data stored in the compressed document file while retrieving the starting tag (previously defining a boundary between compressed data and non-compressed data).

ARRANGEMENT/OPERATIONS OF FOURTH DOCUMENT MANAGING APPARATUS

A document managing apparatus according to a fourth embodiment of the present invention forms the same index file as that of the document managing apparatus according to the third embodiment. It should be understood that the document managing apparatus of the fourth embodiment forms a compressed document file in which first compression data compressed by using a static coding process is mixed with second compression data compressed by way of a dynamic coding process. The fourth document managing apparatus forms a corresponding region management file functioning as a file for defining a relationship between a compressed document file and an index file.

Figure 20:
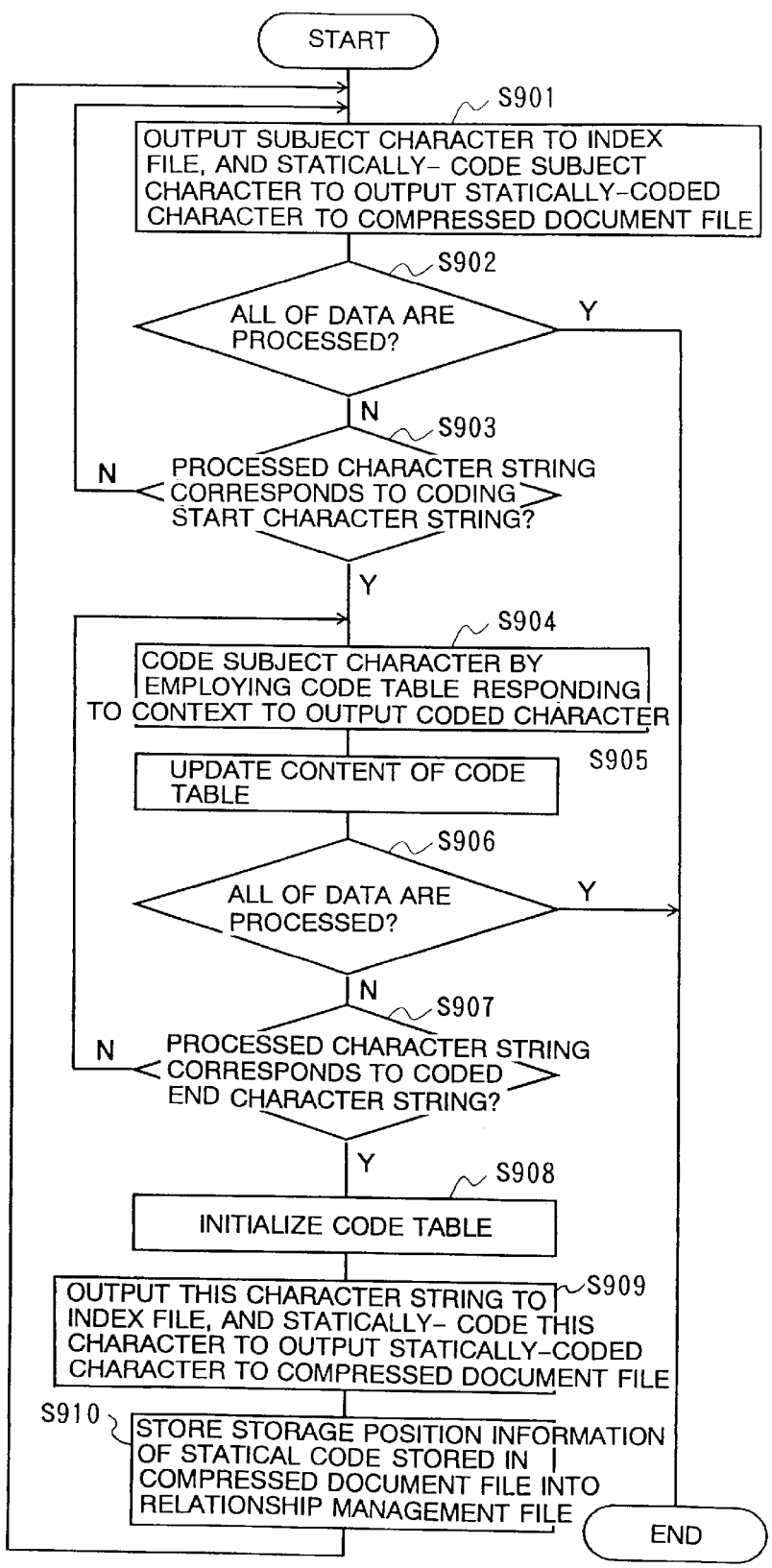
FIG. 20 is a flow chart for describing a sequence to form a compressed document file by an apparatus according to a fourth embodiment of the present invention.

FIG. 20 is a flow chart for indicating a process operation to form the compressed document file by the document managing apparatus (data processing apparatus) of the fourth embodiment. It should also be noted in this fourth document managing apparatus, "</TITLE>", "</SECTION>", and "</SUBSECTION>" are given as a coding start character string, whereas "<SECTION>" and "<SUBSECTION>" are given as a coding end character string.

When a first instruction is issued to compress document data, a first compressed data output process loop (steps S901 to S903) is commenced in the data processing apparatus. In this first compressed data output process loop, one character (character to be processed) in the document data is directly outputted to the index file, and also such a code obtained by coding this subject character by employing the static code table is written into the compressed document file in the fourth data processing apparatus (step S901). At this step S901, the data processing apparatus multiplies a size of data outputted to the compressed document file.

Next, a judgment is made by the data processing apparatus as to whether or not the process operation is complete with respect to all characters constituting the document data (step S902). Then, when data (characters) to be processed are left ("N" at step S902), another judgment is made as to whether or not the character string which has been processed so far is coincident with any of the predetermined coding start character strings (step S903).

In such a case that the processed character string is not coincident with the coding start character string ("N" at step S903), the process operation defined from the above-described step S901 is again executed by the data processing apparatus. On the other hand, when the character string which has been so far processed is coincident with one of the coding start character strings ("Y" at step S903), a second compressed data output process loop (steps S904 to S907) is commenced by this fourth data processing apparatus.

In the second compressed data output process loop, a subsequent one character is read out from the document data, and then a code corresponding to this subject character is outputted in the data processing apparatus (step S904). This code is outputted at this step while referring to a context of this subject character. Also, this data processing apparatus multiplies the data size written in the compressed document file at this step S904. Thereafter, content of the code table related to the context employed in the coding operation is updated by the data processing apparatus (step S905).

Next, the data processing apparatus judges as to whether or not the process operation is accomplished for all of the characters which constitute the document data (step S906). Then, when data to be processed are left ("N" at step S906), the data processing apparatus judges as to whether or not the processed character string is coincident with one of the predetermined coding end character string (step S907). If the processed character string is not coincident with any of the coding end character strings ("N" at step S907), then the data processing apparatus again executes the process operation defined after the step S904. On the other hand, if the processed character string is coincident with one of the coding end character strings ("Y" at step S907), the data processing apparatus initializes the code table (step S908).

Next, the data processing apparatus outputs the coding end character string detected at step S907 to the index file, and also the code obtained by statically coding this character string to the compressed document file (step S909). The data processing apparatus stores storage position information of the stored static code within the compressed document file into the corresponded relationship management file (step S910), and this storage position information is the data sizes up to the head bit of the static code within the compressed document file. It should be noted that the data processing apparatus defines the storage position information based upon the multiplied result of the data sizes which have been so far multiplied, and multiplies this multiplied result by the data size of the static code written at step S909 after the storage position information has been defined.

Thereafter, the data processing apparatus again executes the first compressed data output process loop.

Then, the data processing apparatus accomplishes the compressed document file forming process when a detection is made that the process operation for all of the data has been complete in the first compressed data output process loop ("Y" at step S902), or when another detection is made that the process operation for all of the data has been complete in the second compressed data output process loop ("Y" at step S906).

In other words, as schematically indicated in FIG. 21, a compressed document file such that the first compression data (namely, underlined portion in this drawing) by the static coding operation is mixed with the second compression data by the dynamic coding operation is formed in the document managing apparatus according to the fourth embodiment. Then, the corresponding relationship management file is formed into which the storage position of the head bit of the first compression data after the second is stored.

Next, an explanation will now be made of the index corresponding region decompressing process executed in the document managing apparatus of the fourth embodiment. Since an overall flow operation of this index corresponding region decompressing process is the same as that shown in FIG. 15, an explanation thereof is omitted.

Figure 22:
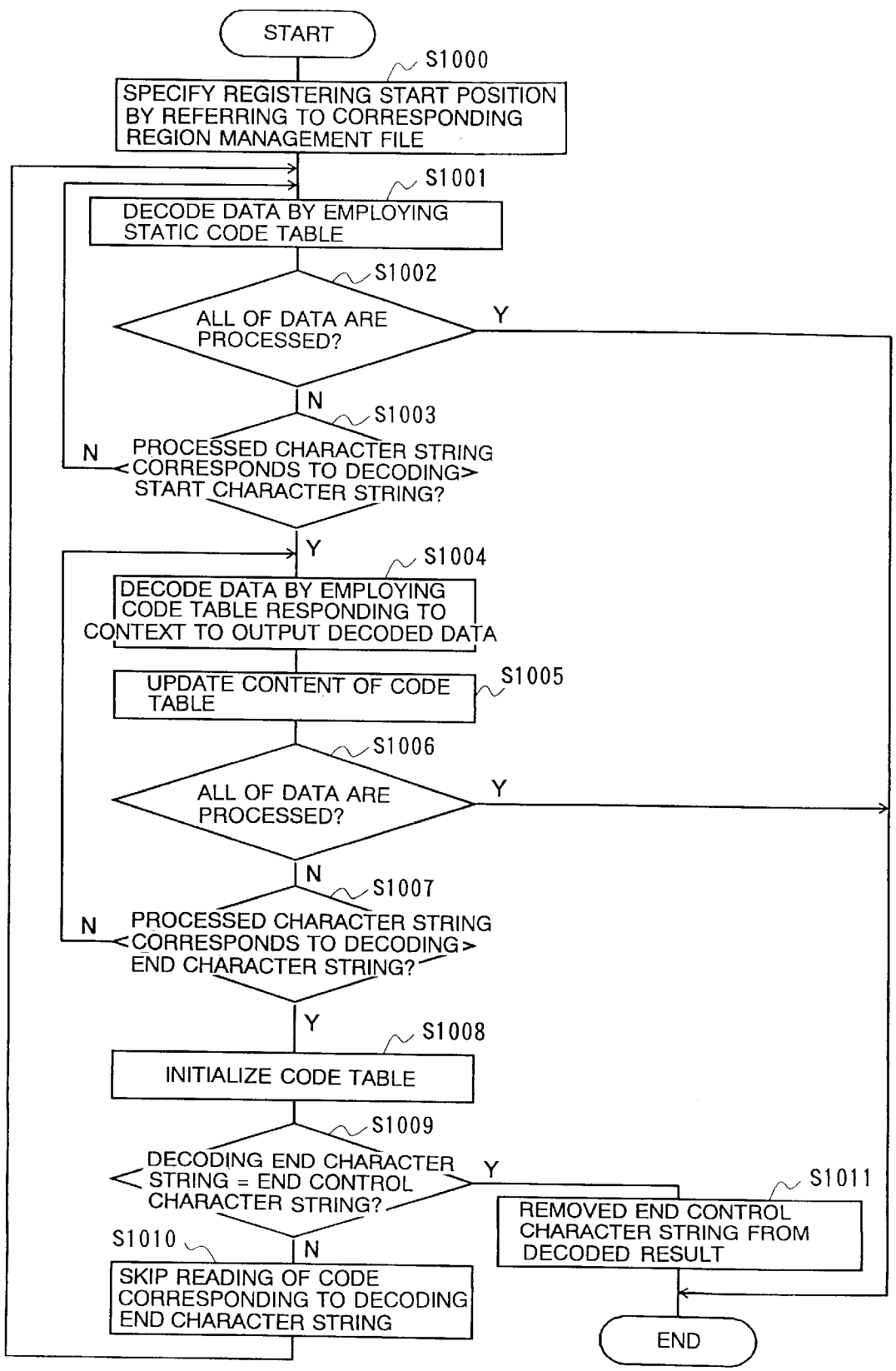
FIG. 22 is a flow chart for describing a partial decompressing process executed by the document managing apparatus according to the fourth embodiment of the present invention.

FIG. 22 indicates a flow chart for explaining a partial decompressing process executed in the fourth document managing apparatus. A basic flow operation of this partial decompressing process is the same as the partial decompressing process of the previously described document managing apparatus of the third embodiment. As a consequence, only different operation steps will now be described.

In the document managing apparatus according to the third embodiment, the decompressing start position is specified by retrieving the storage position of the index data. To the contrary, in the document managing apparatus of the fourth embodiment, the decompressing start position is specified (step S1000) with reference to the corresponding relationship managing file. Concretely speaking, the data processing apparatus first judges that the index data designated by the user corresponds to data stored in the index file. For example, if the index data corresponds to M-th data, then the data processing apparatus reads out (M-1)th storage position information in the corresponding relationship management file. Then, a position determined by this storage position information is specified as the decompressing start position.

Thereafter, the process operation is continued for the data located after the decompressing start position. In this fourth document managing apparatus, the decoding operation is carried out by employing the static code table when the process operation related to the index is executed.

In other words, if the loop executed immediately after the decompressing start position is specified, a necessary amount of data is first read from the compressed document file, and a process operation for decoding this data by employing the static code table is carried out (step S1001). At a step S1010, the data processing apparatus skips reading of the code corresponding to the decoding end character string.

What is claimed is:

1. A document managing apparatus for forming compressed document data in response to an inputted character string, comprising:

control character string storing means for storing more than one starting control character string and more than one end control character string;

compressing means for compressing an inputted character to thereby output compressed character data;

retrieving means for retrieving start control character strings and end control character strings from an inputted character string of successively inputted characters; and control means, when a start control character string is retrieved by said retrieving means, for commencing to output compressed character data produced by said compressing means as an element of the compressed document data, and when an end control character string is retrieved by said retrieving means, for commencing, after outputting the compressed end control character as the element of the compressed document data, to directly output inputted character as it is as another element of the compressed document data.

2. A document managing apparatus as claimed in claim 1, wherein:

said compressing means outputs a code corresponding to said character as the compressed character data by using a dynamic coding model, and said control means initializes the dynamic coding model used by said compressing means when an end control character string is retrieved by said retrieving means.

3. A document managing apparatus as claimed in claim 1, wherein:

when said control means commences to directly output the inputted character as it is as an element of the compressed document data, said control means outputs the end control character string retrieved by said retrieving means.

4. A document managing apparatus as claimed in claim 1, wherein:

when an end control character string is retrieved by said retrieving means, said control means substitutes the inputted character by utilizing a substitution table determining a correspondence relationship between input characters and output characters to thereby output the substituted result without compressing by said compressing means.

5. A document managing apparatus as claimed in claim 4, further comprising:

substituting means for substituting, when an instruction is issued to retrieve a certain character string with respect to the compressed document data, said certain character string by using said substitution table; and retrieving means for executing a retrieval with employment of the certain character string substituted by said substituting means.

6. A document managing apparatus for managing document data in which start control character strings and end control character strings have been inserted before/after each of plural document elements, and said start control character string and said end control character string corresponding to a content of said document element, comprising:

display means for displaying data;

control character string storing means for storing more than one start control character string and more than one end control character string;

first reading means for sequentially reading a character contained in document data to be compressed;

first outputting means for directly outputting the character read by said first reading means as an element of a compressed document file, and also for outputting said read character as an element of an index file;

first control means for stopping the reading operation of said first reading means when said first reading means reads the same character string as any of said start control character strings stored in said control character string storing means;

second reading means for commencing a reading operation of a character contained in said document data when the reading operation of said first reading means is stopped by said first control means;

second outputting means for outputting as an element of compressed document data a code corresponding to the character read by said second reading means;

second control means, when said second reading means reads the same character string as any of the end control character string stored in said control character string storing means, for stopping the reading operation by said second reading means and also for restarting the reading operation by said first reading means;

storing means for storing said compressed document file and said index file;

display control means for displaying the respective data segmented by said end control character string and contained in said index file stored in said storing means, on said display means as an index when a predetermined instruction is issued;

designating means for designating one index from the indexes displayed by said display control means;

storage position specifying means for specifying a storage position of the index designated by said designating means within said compressed document file; and partially decompressing means for decompressing data located subsequent to the storage position specified by said storage position specifying means and stored in said compressed document file until any of the end control character strings stored in said control character string storing means is restored.

7. A document managing apparatus as claimed in claim 6 wherein:

said document managing apparatus further comprises:

multiplied size detecting/storing means for detecting a multiplied size of data to store the detected multiplied size, said data being outputted as the elements of the compressed document data every time said first output means commences to output the elements of the compressed document data; and said storage position specifying means specifies the storage position of said index within the compressed document file based on the multiplied size stored in said multiplied size detecting/storing means.

8. A document managing apparatus as claimed in claim 7 wherein:

said partially decompressing means includes:

restore-not-required data recognizing means for recognizing that the data located preceding the storage position specified by said storage position specifying means and contained in said compressed document file is equal to processed data;

first data reading means for sequentially reading unprocessed data contained in said compressed document file every one character;

first decoding means for outputting the data read by said first data reading means as a decoded result;

first reading control means for stopping the reading operation of said first data reading means when said first decoding means outputs the same character string as any of said start control character strings stored in said control character string storing means;

second data reading means for commencing a reading operation of the unprocessed data contained in said compressed document file when the reading operation of said first data reading means is stopped by said first reading control means;

second decoding means for outputting a character obtained by decoding the data read by said second data reading means;

second reading control means, when said second decoding means outputs the same character string as any of the end control character string stored in said control character string storing means, for stopping the reading operation by said second data reading means; and third reading control means for restarting the reading operation of said first data reading means when the control operation is carried out by said second reading control means, in the case that the character string read by said second data reading means is not equal to an end control character string corresponding to a start control character string contained in a tail of an index specified by said specifying means.

9. A data compressing method for compressing original data into which a start control character string and an end control character string are inserted, comprising:

a retrieving step where the start control character string and the end control character string are retrieved from said original data; and a data processing step where when said start control character string is retrieved at said retrieving step, a process operation is commenced to output compressed data obtained by compressing original data subsequent to the first-mentioned original data, wherein when said end control character string is retrieved in said retrieving step, another process operation is commenced to directly output the original data subsequent to the first mentioned original data.

10. A data compressing method as claimed in claim 9 wherein:

said data processing step performs the compressing operation by employing a dynamic compressing model, and initializes said dynamic compressing model when said end control character string is retrieved at said retrieving step.

11. A data compressing method as claimed in claim 9 wherein:

in said data processing step, when the process operation to output the compressed data is commenced, said end control character string retrieved at said retrieving step is outputted as an element of the compressed data.

12. A data compressing method as claimed in claim 9, wherein:

in said data processing step, when said end control character string is retrieved in said retrieving step, a process operation is commenced to output data obtained by substituting original data subsequent to the first-mentioned original data by employing a predetermined substitution table.

13. A data decompressing method for decompressing compressed data where data having a start control character string at a tail thereof is mixed with data obtained by compressing data having an end control character string at a tail thereof, comprising:

a judging step for judging whether a start control character string or an end control character string is present at a tail of decoded data; and a data processing step where, when the presence of said start control character string is judged at said judging step, a process operation is commenced to output as a restored result a character obtained by decompressing compressed data subsequent to the first-mentioned compressed data, and when said end control character string is retrieved in said judging step, another process operation is commenced to directly output as the restored result, the compressed data subsequent to the first-mentioned compressed data.

14. A data decompressing method as claimed in claim 13, wherein:

said data processing step performs the compressing operation by employing a dynamic compressing model, and initializes said dynamic compressing model when said end control character string is retrieved at said retrieving step.

15. A data decompressing method as claimed in claim 13, wherein:

in said data processing step, when a process operation to output a decompressed character is commenced, a first decompressed control character string is not handled as the restored result.

16. A data decompressing method as claimed in claim 13, wherein:

in said data processing step, when said end control character string is present in said judging step, a process operation is commenced to output restored data obtained by substituting compressed data subsequent to the first-mentioned compressed data employing a predetermined substitution table.

17. A document managing apparatus for outputting document data obtained by decompressing compressed document data inputted thereinto, comprising:

control character string storing means for storing more than one start control character string and more than one end control character string;

decompressing means for decompressing a character contained in the compressed document data;

judging means for judging whether or not a start control character string, or an end control character string is present at a tail of a decompressed character string; and control means, when said judging means judges the presence of a start control character string, for commencing to output a character produced by said decompressing means, and when said judging means retrieves an end control character string, for commencing to directly output a character contained in the compressed document data as it is.

18. A document managing apparatus for managing document data in which a start control character string and an end control character string have been inserted before/after each of plural document elements, and said start control character string and said end control character string correspond to a content of said document element, comprising:

display means for displaying data;

control character string storing means for storing more than one start control character string and more than one end control character string;

first reading means for sequentially reading a character contained in document data to be compressed;

first outputting means for directly outputting a code obtained by statically coding the character read by said first reading means as an element of a compressed document file, and also for outputting said read character as an element of an index file;

first control means for stopping the reading operation of said first reading means when said first reading means reads the same character string as any of said start control character strings stored in said control character string storing means;

second reading means for commencing a reading operation of a character contained in said document data when the reading operation of said first reading means is stopped by said first control means;

second outputting means for outputting as an element of compressed document data a code obtained by dynamically coding the character read by said second reading means;

second control means, when said second reading means reads the same character string as any of the end control string stored in said control character string storing means, for stopping the reading operation by said second reading means, for initializing a model employed to dynamically coding the character by said second output means, and also for restarting the reading operation by said first reading means;

multiplied size detecting/storing means for detecting a multiplied size of data which have been outputted as the elements of the compressed document file by said first outputting means and said second outputting means every time said first output means starts to output said character, and for storing said detected multiplied size;

storing means for storing said compressed document file and said index file;

first display control means for displaying as an index the respective data segmented by said start control character string and contained in said index file stored in said storing means, on said display means when a predetermined instruction is issued;

designating means for designating one index from the indexes displayed by said first display control means;

decoding-not-required data recognizing means for specifying a storage position of the index designated by said designating means within said compressed document file based on the multiplied size stored in said multiplied size detecting/storing means, and for recognizing data preceding said designated index within said compressed document file as processed data;

first data reading means for reading unprocessed data contained in said compressed document file;

first decoding means for outputting a character obtained by statically decoding the data read by said first data reading means as a decoded result;

first decoding control means for stopping the reading operation of said first data reading means when said first decoding means decodes the same character string as any of said start control character strings stored in said control character string storing means;

second data reading means for commencing a reading operation of unprocessed data contained in said compressed document file when the reading operation of said first data reading means is stopped by said first decoding control means;

second decoding means for outputting a character obtained by dynamically decoding the data read by said second data reading means;

second decoding control means, when said second decoding means decodes the same character string as any of the end control string stored in said control character string storing means, for stopping the reading operation by said second data reading means and also for initializing a model used to dynamically decode the data by said second decoding means; and third decoding control means for restarting the reading operation of said first reading means when the control operation is carried out by said second decoding control means, in the case that the character string decoded by said second decoding means is not equal to an end control character string corresponding to a start control character string contained in a tail of an index designated by said designating means.

19. A document managing apparatus for forming compressed document data in response to an input character string of successively input characters, comprising:

compressing means for compressing designated input characters to form compressed character data and non-compressed character data;

retrieving means for retrieving a start control character string and an end control character string from the input character string; and control means for outputting compressed character data as compressed document data when a start control character string is received by said retrieving means, and non-compressed character data when an end control character string is retrieved by said retrieving means.

20. A document managing apparatus for forming compressed document data in response to an input character string of successively input characters, comprising:

compressing means for compressing designated input characters to form compressed character data and non-compressed character data;

retrieving means for retrieving a start control character string and an end control character string from the input character string;

first control means for outputting compressed character data as compressed document data when a start control character string is received by said retrieving means, and non-compressed character data when an end control character string is retrieved by said retrieving means;

decompressing means for decompressing compressed character data in the compressed document data;

judging means for judging whether a start control character string or an end control character string is present; and second control means for outputting a character produced by the decompressing means when a start control character string is present, and a non-compressed character when an end control character string is present.

* * * * *

UNITED STATES PATENT AND TRADEMARK OFFICE
CERTIFICATE OF CORRECTION

PATENT NO. : 5,854,597
DATED : December 29, 1998
INVENTOR(S) : Murashita et al

It is certified that error appears in the above-identified patent and that said Letters Patent is hereby corrected as shown below:

```
Title page [75] change "Kanagawa" to --Kawasaki--.

Col. 2,    line 25, change "word" to --words--.

Col. 6,    line 5, continue paragraph with next line "The
                    storing..."

line 11, continue paragraph with next line "The
                    designating...."

Col. 11,   line 16, change "function" to --functions--.

Col. 12,   line 52, delete "this".

Col. 13,   line 23, delete "for".

Col. 17,   line 31, change "do" to --document--;

line 59, change "code" to --code,--.
```

UNITED STATES PATENT AND TRADEMARK OFFICE
CERTIFICATE OF CORRECTION

PATENT NO. : 5,854,597

DATED : December 29, 1998   PAGE 2 of 2

INVENTOR(S) : Murashita et al.

It is certified that error appears in the above-identified patent and that said Letters Patent is hereby corrected as shown below:

Col. 21, line 43, change "or" to --on--;

line 45, after "clicked" insert --when--.

Col. 25, line 7, change "In such a case that" to --When--;

line 12, change "so far processed" to --processed so far--.

Signed and Sealed this

First Day of June, 1999

Attest:

Attesting Officer

Q. TODD DICKINSON

Acting Commissioner of Patents and Trademarks